United States Patent
Aizenberg et al.

(10) Patent No.: US 7,115,900 B2
(45) Date of Patent: Oct. 3, 2006

(54) DEVICES HAVING PATTERNED REGIONS OF POLYCRYSTALLINE ORGANIC SEMICONDUCTORS, AND METHODS OF MAKING THE SAME

(75) Inventors: Joanna Aizenberg, New Providence, NJ (US); Zhenan Bao, Millburn, NJ (US); Alejandro L. Briseno, Baldwin Park, CA (US); Yong-Jin Han, Springfield, NJ (US); Hyunsik Moon, Ann Arbor, MI (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/722,613

(22) Filed: Nov. 26, 2003

(65) Prior Publication Data

US 2005/0110006 A1    May 26, 2005

(51) Int. Cl.
*H01L 35/24* (2006.01)

(52) U.S. Cl. .............. 257/40; 257/642; 257/E51.011; 438/82; 438/99; 427/596; 430/200; 430/270.1; 428/413; 428/447

(58) Field of Classification Search ............... 257/40, 257/642, E39.007, E51.001, E51.003, E51.01, 257/E51.011, E51.013, E51.015, E51.017, 257/E51.024, E51.027, E27.117, E25.008; 438/82, 99, 725, 780; 427/596; 430/200, 430/201, 270.1, 273.1, 7, 11, 327; 428/413, 428/447
See application file for complete search history.

(56) References Cited

U.S. PATENT DOCUMENTS

| | | | |
|---|---|---|---|
| 5,192,580 A | 3/1993 | Blanchet-Fincher | 427/596 |
| 5,288,528 A | 2/1994 | Blanchet-Fincher | 427/596 |
| 5,347,144 A | 9/1994 | Garnier et al. | 257/40 |
| 5,523,192 A | 6/1996 | Blanchet-Fincher | 430/200 |
| 5,563,019 A | 10/1996 | Blanchet-Fincher | 430/200 |
| 5,625,199 A | 4/1997 | Baumbach et al. | 257/40 |
| 5,766,819 A | 6/1998 | Blanchet-Fincher | 430/201 |
| 5,840,463 A | 11/1998 | Blanchet-Fincher | 430/201 |
| 5,981,970 A | 11/1999 | Dimitrakopoulos et al. | 257/40 |
| 6,051,318 A | 4/2000 | Kwon | 428/413 |
| 6,143,451 A | 11/2000 | Blanchet-Fincher | 430/11 |
| 6,146,792 A | 11/2000 | Blanchet-Fincher et al. | 430/7 |
| 6,174,651 B1 | 1/2001 | Thakur | 430/327 |
| 6,265,243 B1 | 7/2001 | Katz et al. | 438/99 |
| 6,352,811 B1 | 3/2002 | Patel et al. | 430/270.1 |

(Continued)

FOREIGN PATENT DOCUMENTS

WO    WO 01/87634 A2    11/2001

(Continued)

OTHER PUBLICATIONS

U.S. Appl. No. 10/256,885, filed Sep. 27, 2002, Bao et al.

(Continued)

*Primary Examiner*—Nathan J. Flynn
*Assistant Examiner*—Scott R. Wilson

(57) ABSTRACT

Semiconductor apparatus comprising a substrate having a substrate surface; a first dielectric layer comprising molecules of a first compound, the molecules of the first compound having first ends and second ends, the first ends being covalently bonded to a first region of the substrate surface, the second ends having aromatic regions; and a polycrystalline semiconductor layer comprising organic semiconductor molecules with aromatic portions, the polycrystalline semiconductor layer being on the first region of the substrate. Integrated circuits comprising apparatus, and methods for making apparatus and integrated circuits.

20 Claims, 7 Drawing Sheets

U.S. PATENT DOCUMENTS

| | | | |
|---|---|---|---|
| 6,352,812 B1 | 3/2002 | Shimazu et al. | 430/273.1 |
| 6,403,397 B1 | 6/2002 | Katz | 438/99 |
| 6,551,717 B1 | 4/2003 | Katz et al. | 428/447 |
| 2002/0149315 A1 | 10/2002 | Blanchet-Fincher | 313/504 |
| 2003/0175551 A1 | 9/2003 | Smith et al. | 428/690 |
| 2004/0161873 A1* | 8/2004 | Dimitrakopoulos et al. | 438/99 |

FOREIGN PATENT DOCUMENTS

| | | |
|---|---|---|
| WO | WO 02/08801 A1 | 1/2002 |
| WO | WO 02/092352 A1 | 11/2002 |

OTHER PUBLICATIONS

U.S. Appl. No. 10/669,780, filed Sep. 24, 2003, Bao.

U.S. Appl. No. 60/505,533, filed Sep. 24, 2003, Meth.

U.S. Appl. No. 60/505,880, filed Sep. 24, 2003, Meth et al.

U.S. Appl. No. 10/671,303, filed Sep. 24 2003, Bao et al.

U.S. Appl. No. 10/701,183, filed Nov. 4, 2003, Akkeman et al.

Afzali et al., High-Performance, Solution-Processed Organic Thin Film Transistors from a Novel Pentacene Precursor, J. Am. Chem. Soc., 2002, pp. 8812-8813, vol. 124.

Afzali et al., Synthesis and Application of Pentacene Precursor in OTFT, Publisher: IBM Research Division, Published in : Yorktown Heights, NY.

Aizenberg et al., Control of Crystal Nucleation by Patterned Self-Assembled Monolayers, Nature, Apr. 8, 1999, pp. 495-498, vol. 398.

Aizenbertg et al., Oriented Growth of Calcite Controlled by Self-Assembled Monolayers of Functionalized Alkanethiols Supported on Gold and Silver, J. Am. Chem. Soc., 1999, pp. 4500-4509, vol. 121.

Akimichi et al., Field-Effect Transistors Using Alkyl Substituted Oligothiophenes, Appl. Phys. Lett., 1991, pp. 1500-1502, vol. 58, No. 14.

Butko et al., Limit of Field Effect Mobility on Pentacene Single Crystal, Publisher: Los Alamos National Laboratory, Published in: Los Alamos, New Mexico.

Cai et al., Self Assembly in Ultrahigh Vacuum: Growth of Organic Thin Films with a Stable In-Plane Directional Order, J. Am. Chem. Soc., 1998, pp. 8563-8564, vol. 120.

Collet et al., High Anisotropic Conductivity in Organic Insulator/Semiconductor Monolayer Heterostructure, Applied Physics Letters, Mar. 6, 2000, pp. 1339-1341, vol. 76, No. 10, Publisher: American Institute of Physics.

Collet et al., Low-Voltage, 30 nm Channel Length, Organic Transistors with a Self-Assembled Monolayer as Gate Insulating Films, Applied Physics Letters, Apr. 3, 2000. pp. 1941-1943, vol. 76, No. 14.

Collet et al., Nano-field Effect Transistor with an Organic Self Assembled Monolayer as Gate Insulator, Applied Physics Letters, Nov. 2, 1998, pp. 2681-2683, vol. 73, No. 18.

De Boer et al., Synthesis and Characterization of Conjugated Mono- and Dithiol Oligomers and Characterization of Their Self-Assembled Monolayers, Langmuir, 2003, pp. 4272-4284, vol. 19.

Echavarren et al., J. Am. Chem. Soc., 1987, pp.5478-5486, vol. 109.

Forrest, Ultrathin Organic Films Grown by Organic Molecular Beam Deposition and Related Techniques, Chem. Rev., pp. 1793-1896, vol. 97, Publisher: American Chemical Society.

Halik et al., High-Mobility Organic Thin-Film Transistors Based on a, a'-didecyloligothiophenes, Journal of Applied Physics, Mar. 1, 2003, pp. 2977-2981, vol. 93, No. 5.

Han et al., Effect of Magnesium Ions on Oriented Growth of Calcite on Carboxylic Acid Functionalized Self-Assembled Monolayer, J. Am. Chem. Soc., 2003, pp. 4032-4033, vol. 125.

Han et al., Face-Selective Nucleation of Calcite on Self-Assembled Monolayers of Alkanethiols: Effect of the Parity of the Alkyl Chain, Angew. Chem. Int. Ed., 2003, pp. 3668-3670, vol. 42.

Hong et al., Thiophene-Phenylene and Thiophene-Thiazole Oligomeric Semiconductors with High Field-Effect Transistor On/Off Ratios, Chem. Mater., 2001, pp. 4686-4691, vol. 13, No. 12.

Johnston et al., Low-Energy Vibrational Modes in Phenylene Oligomers Studied by THz Time-Domain Spectroscopy, Chemical Physics Letters, 2003, pp. 256-262, vol. 377.

Katz et al., Synthesis, Solubility, and Field-Effect Mobility of Elongated and Oxa-substituted a,w-Dialkyl Thiophene Oligomers: Extension of 'Polar Intermediate' Synthetic Strategy and Solution Deposition on Transistor Substrates, Chem. Mater., 1998, pp. 633-638, vol. 10, No. 2.

Klauk et al., High-Mobility Polymer Gate Dielectric Pentacene Thin Film Transistors, Journal of Applied Physics, Nov. 1, 2002, pp. 5259-5263, vol. 92, No. 9.

Klauk et al., Pentacene Organic Thin-Film Transistors and ICs, Solid State Technology, Mar. 2000, pp. 63-76, vol. 43, No. 3.

Li et al., Field-Effect Transistors Based Thiophene Hexamer Analogues with Diminished Electron Donor Strength, Chem. Mater., 1999, pp. 458-465, vol. 11, No. 2.

Matters et al., Organic Field-Effect Transistors and All-Polymer Integrated Circuits, Optical Materials, 1999, pp. 189-197, vol. 12.

Meyer Zu Heringdorf et al., Growth Dynamics of Pentacene Thin Films, Nature, Aug. 2, 2001, pp. 517-520, vol. 412.

Mushrush et al., Easily Processable Phenylene-Thiophene-Based Organic Field-Effect Transistors and Solution-Fabricated Nonvolatile Transistor Memory Elements, J. Am. Chem. Soc., 2003, pp. 9414-9423, vol. 125, No. 31.

Seo et al., Interpretation of the Mass Change Behavior in the Binary Monlayer of Hydroquinone-tethered Alkylthiol and Aminoalkythiol, Bull. Korean Chem. Soc., 2002, pp. 1671-1673, vol. 23, No. 11.

Stabel et al., Scanning Tunneling Microscopy of Alkylated Oligothiophenes at Interfaces with Graphite, Synthetic Metals, 1994, pp. 47-53, vol. 67.

Tanimoto et al., Binary Phase Chlorination of Aromatic Hydrocarbons with Solid Copper(II) Chloride: Reaction Mechanism, Bull. Chem. Soc. Japan, 1979, pp. 3586-3591, vol. 52, No. 12.

Xia et al., Soft Lithography, Angew. Chem. Int. Ed., 1998 pp. 550-575, vol. 37.

Qin et al., "Fabrication of Ordered Two-Dimensional Arrays of Micro- and Nanoparticles Using Patterned Self-Assembled Monolayers as Templates", Adv. Mater., vol. 11, No. 17, pp. 1433-1437 (1999).

Steudel et al., "Patterned growth of pentacene," Applied Physics Letters, vol. 85, No. 23, pp. 5550-5552 (Dec. 6, 2004).

* cited by examiner

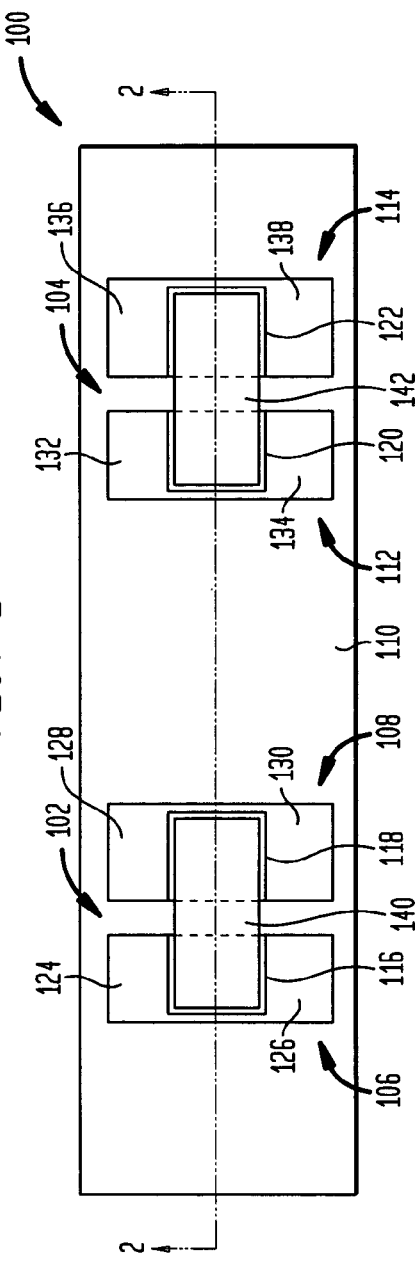
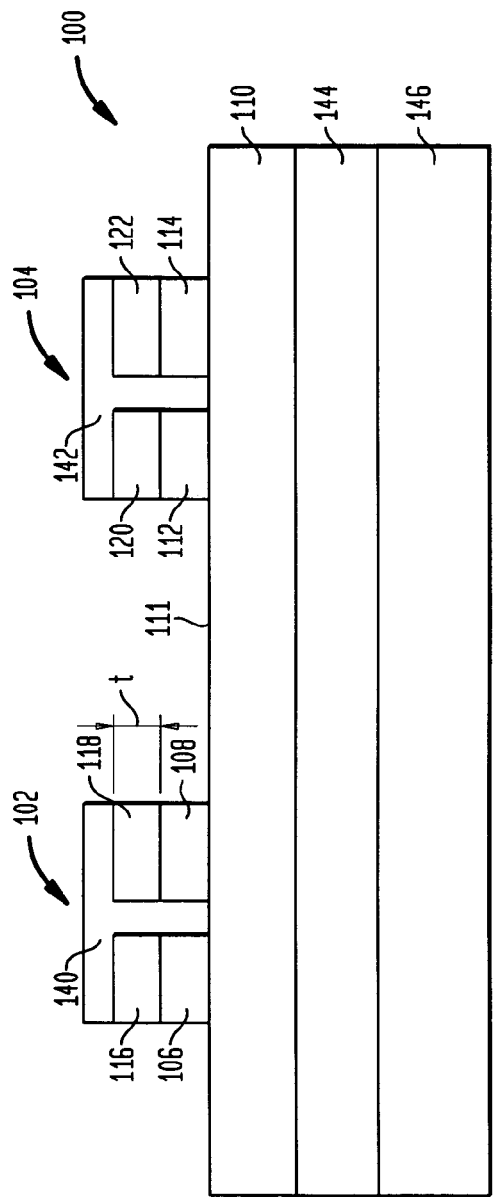

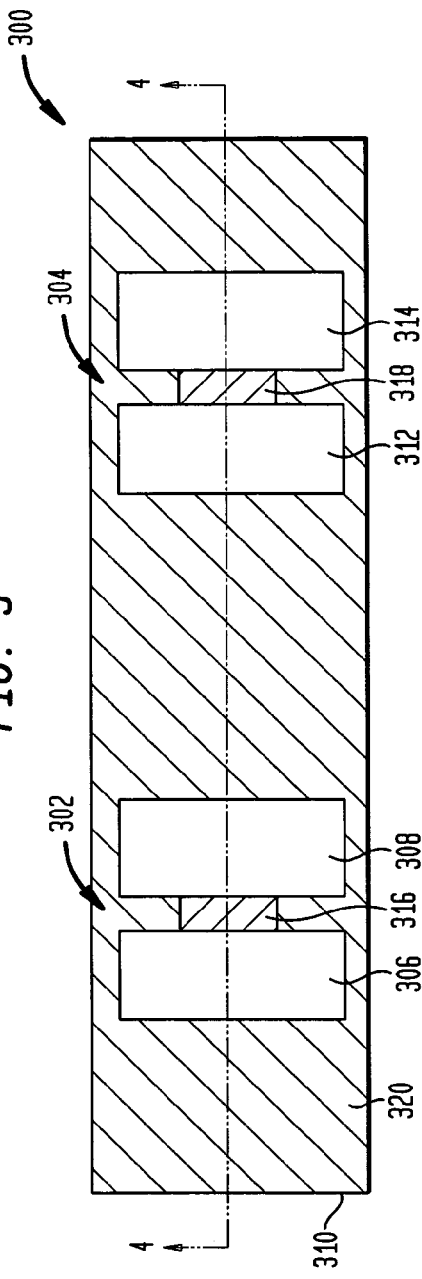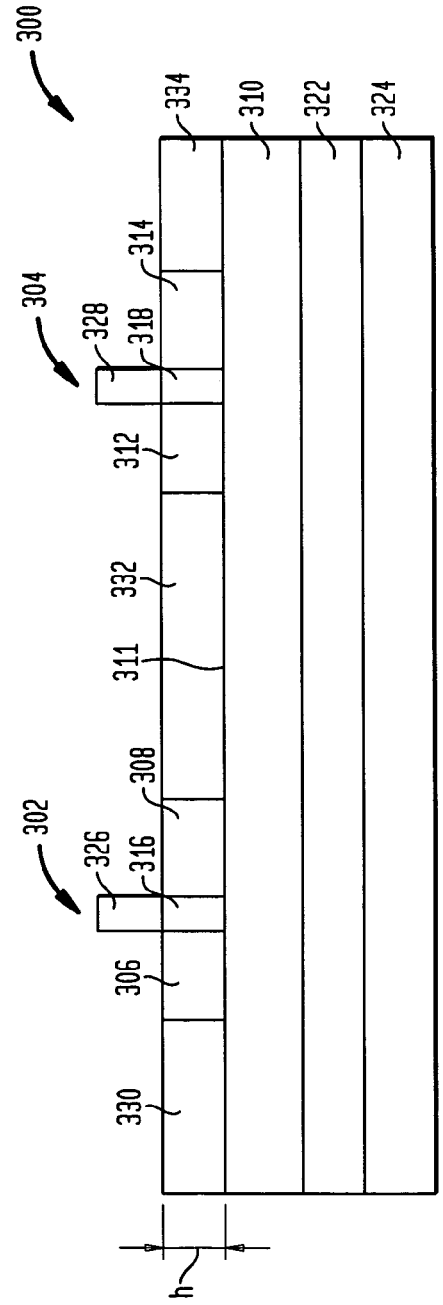

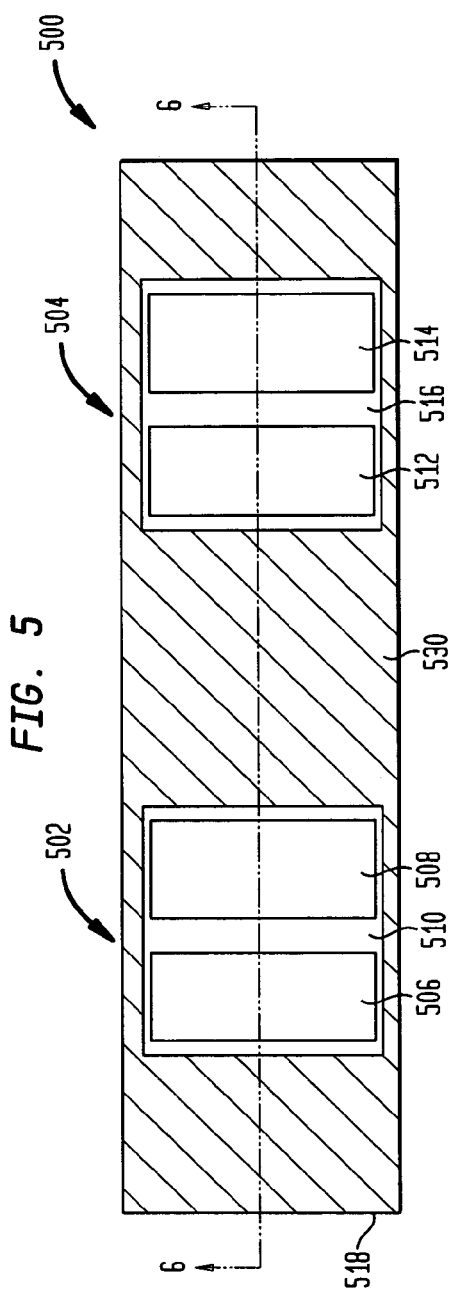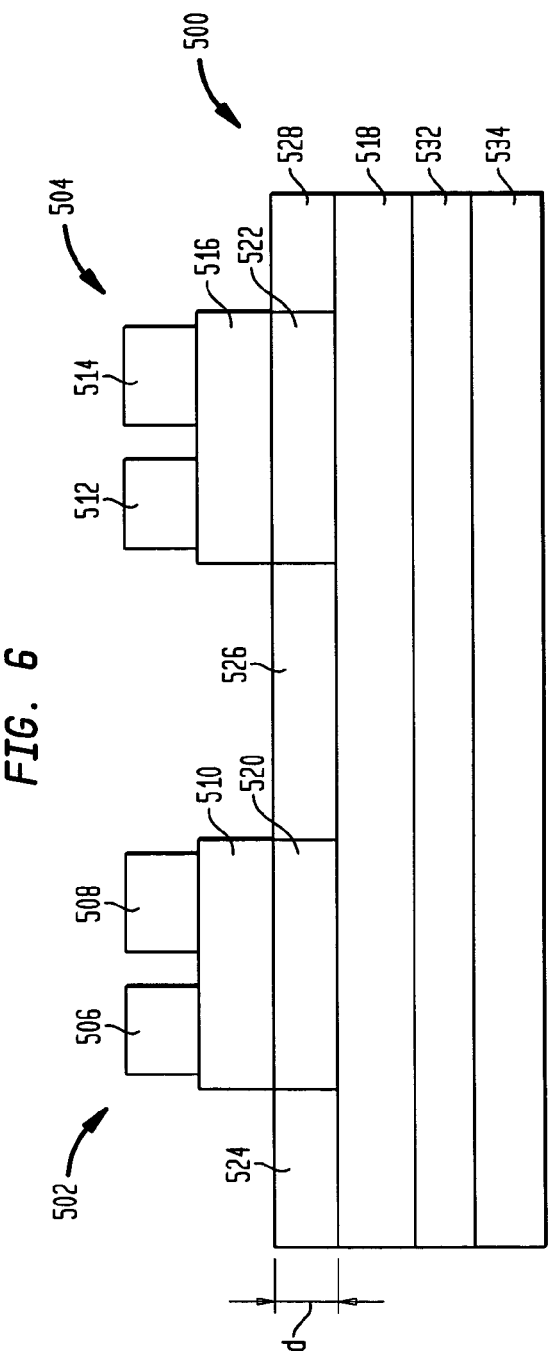

DEVICES HAVING PATTERNED REGIONS OF POLYCRYSTALLINE ORGANIC SEMICONDUCTORS, AND METHODS OF MAKING THE SAME

FIELD OF THE INVENTION

The present invention relates to organic semiconductor devices and circuits containing organic semiconductor devices.

BACKGROUND OF THE INVENTION

Semiconductor devices are typically formed as multilayer structures in which the semiconductor materials are present in a patterned array that defines channels for the transport of charge carriers. For example, an inorganic semiconductor layer may be applied to a dielectric substrate surface. A mask may then be applied to protect patterned regions of the semiconductor layer, intended to constitute charge carrier channels, from a subsequently applied etchant. The etchant then removes the semiconductor in the unmasked regions, leaving behind a finely patterned array of semiconductor channels on the substrate. In the absence of such patterning, the semiconductor devices may be inoperable or be subject to excessive crosstalk.

Inorganic semiconductors typically are rigid and brittle at ambient temperatures. Hence, semiconductor devices formed with inorganic semiconductors generally are rigid as well. As the myriad end use applications for semiconductor devices have evolved, availability of semiconductor devices that can be flexed and bent without damage has become desirable. Flexible semiconductor device structures also offer a potential capability for fabrication of large area device arrays at low unit costs.

Much work has been done to develop organic semiconductors for applications where flexible semiconductor devices are needed. However, organic semiconductors generally cannot survive the harsh conditions required in order to carry out an etching step to generate a patterned array of channels for charge carrier transport. Printing processes have accordingly been sought in order to directly provide a patterned semiconductor channel array without a need to remove regions of a continuous layer of semiconductor material. However, in some cases the fine feature definition that is needed to generate microarrays of semiconductor channels has not been attained with acceptable reproducibility by direct printing of organic semiconductors.

Tetracene, for example, is an organic semiconductor of great interest due to its high charge carrier mobility in a single crystal. Single plate-like crystals of tetracene having dimensions as large as 5 millimeters long, 5 millimeter wide, and 0.25 millimeter thick have been produced. For example, individual thin film field effect transistors comprising single tetracene crystals have been made with high channel mobilities within a range of between about 0.1 centimeters squared per volt-second ($cm^2/Vs$) and about 1 $cm^2/Vs$, at room temperature. However, tetracene thin film field effect transistors in general have low mobilities and on/off current ratios, and their integration into a circuit may require further development. Furthermore, vacuum evaporation of tetracene leads to poorly defined and irregular boundaries between crystal grains that leads to low mobility and makes such grains unusable in fabricating semiconductor devices such as transistors or arrays comprising transistors.

One effort to generate a patterned array of semiconductor film channels comprising an aromatic acene semiconductor involved the direct printing of a pentacene precursor, which was then converted into pentacene. See, for example, Dimitrakopoulos et al. U.S. Pat. No. 5,981,970, issued on Nov. 9, 1999 and entitled, "Thin-film field-effect transistor with organic semiconductor requiring low operating voltages." See also, Afzali, A., Dimitrakopoulos, C. D., and Breen, T. L., "High-performance, solution-processed organic thin film transistors from a novel pentacene precursor," J. Am. Chem. Soc. 124 (30), pp. 8812–8813, Jul. 31, 2002. The entireties of both of the foregoing documents are hereby incorporated herein in their entirety.

Another process for forming patterned organic semiconductor films is disclosed in Katz U.S. Pat. No. 6,403,397 issued on Jun. 11, 2002, which is entitled "Process For Fabricating Organic Semiconductor Device Involving Selective Patterning", the entirety of which is hereby incorporated herein. This process involves treating a surface to selectively provide regions of greater affinity and lesser affinity for either an organic semiconductor or an organic semiconductor solution. When the organic semiconductor, or solution comprising the semiconductor, was deposited on the treated surface, either the organic semiconductor or the organic semiconductor solution dewetted from the lesser affinity regions or the resultant film adhered only weakly to the lesser affinity regions such that selective removal was readily performed. Even where such removal was not performed, the portions of the organic semiconductor film on the greater affinity regions exhibited higher conductivity and better film continuity relative to the other portions of the film.

There remains a need for semiconductor devices comprising organic semiconductors having finely patterned regions of high charge carrier mobility. There further is a need for methods of making semiconductor devices with organic semiconductors that are not easily patterned.

SUMMARY OF THE INVENTION

The present invention provides semiconductor apparatus in which patterned regions of a polycrystalline aromatic organic semiconductor are grown on a substrate. The patterning is directed by materials applied to the substrate to either promote or inhibit nucleation of crystals of the organic semiconductor. The material that promotes nucleation of the aromatic semiconductor comprises an aromatic moiety that can interact with the aromatic semiconductor. The exemplary material that inhibits nucleation of the aromatic semiconductor comprises a non-aromatic moiety or an aromatic moiety having insufficient conjugated pi-electrons to effectively interact with the aromatic semiconductor.

In one embodiment, a semiconductor apparatus is provided, comprising a substrate having a substrate surface; and a first dielectric layer comprising molecules of a first compound, the molecules of the first compound having first ends and second ends, the first ends being covalently bonded to a first region of the substrate surface, the second ends having aromatic regions. A polycrystalline semiconductor layer comprising organic semiconductor molecules with aromatic portions is also provided, the polycrystalline semiconductor layer being on the first region of the substrate.

In another embodiment, such a semiconductor apparatus is provided in which the organic semiconductor molecules comprise y conjugated pi-electrons, in which y is an integer of 10 or more, and the second ends of molecules of the first compound comprise at least y minus 8 conjugated pi-electrons.

In a further embodiment, such a semiconductor apparatus is provided comprising a second dielectric layer comprising molecules of a second compound, the molecules of the second compound having third ends and fourth ends, the third ends being covalently bonded to a second region of the substrate surface, the fourth ends comprising no more than y minus 8 conjugated pi-electrons.

In an additional embodiment, a method of making a semiconductor apparatus is provided, comprising the steps of providing a substrate having a substrate surface; and providing a first dielectric layer comprising molecules of a first compound, the molecules of the first compound having first ends and second ends, the first ends being covalently bonded to a first region of the substrate surface, the second ends having aromatic regions. Further, a polycrystalline semiconductor layer is provided comprising organic semiconductor molecules with aromatic portions, the polycrystalline semiconductor layer being on the first region of the substrate.

The present invention further provides methods of making such semiconductor apparatus. In further embodiments, integrated circuits comprising semiconductor apparatus and methods for making such integrated circuits are provided.

A more complete understanding of the present invention, as well as further features and advantages of the invention, will be apparent from the following detailed description and the accompanying drawings.

BRIEF DESCRIPTION OF THE DRAWINGS

FIG. 1 shows a top view of an exemplary embodiment of two thin film transistors;

FIG. 2 shows a cross-sectional view of the exemplary embodiment of FIG. 1;

FIG. 3 shows a top view of another exemplary embodiment of two thin film transistors;

FIG. 4 shows a cross-sectional view of the exemplary embodiment of FIG. 3;

FIG. 5 shows a top view of a further exemplary embodiment of two thin film transistors;

FIG. 6 shows a cross-sectional view of the exemplary embodiment of FIG. 5;

Figure 7:
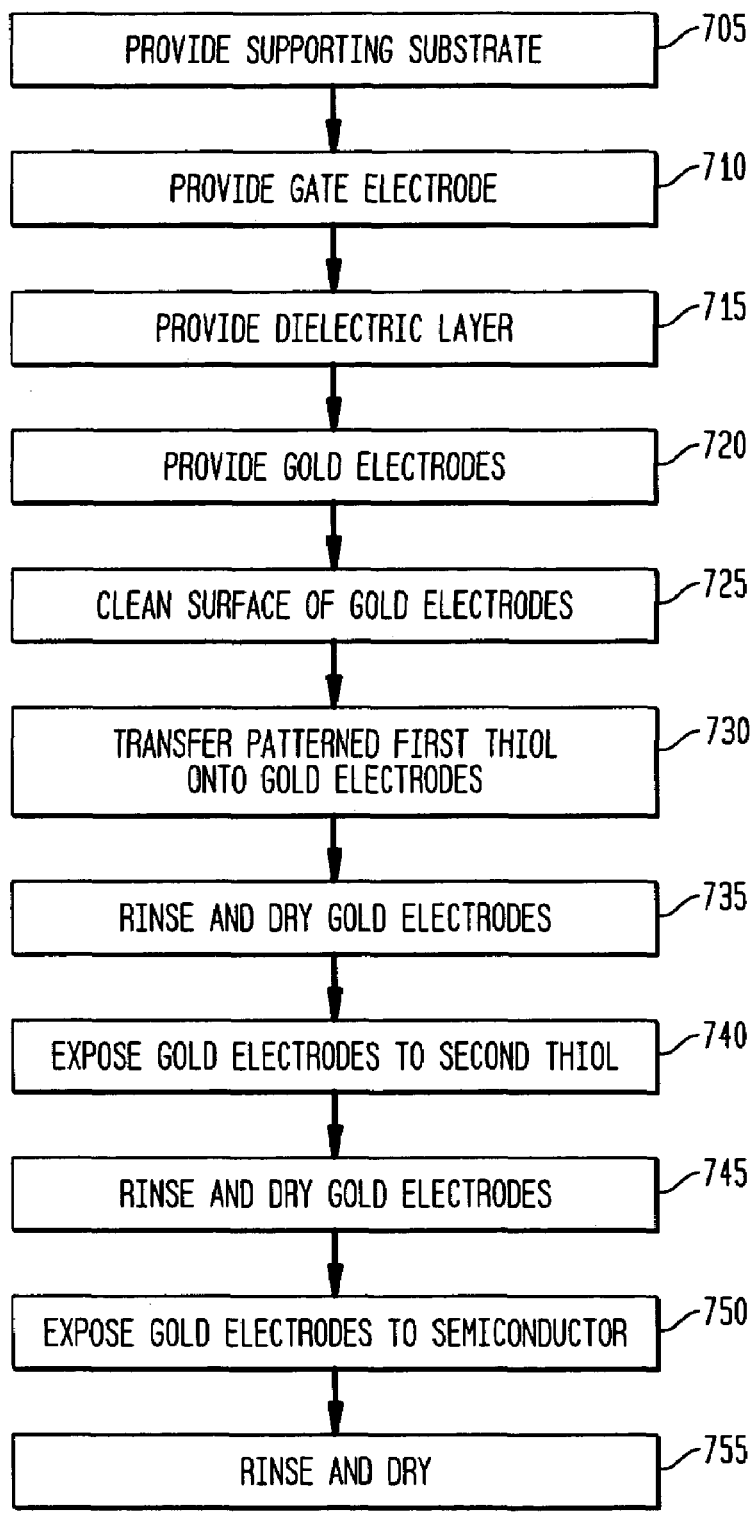
FIG. 7 shows a flow chart for an exemplary method of making the thin film transistors shown in FIGS. 1 and 2.

The drawings of this specification are not to scale but are merely schematic representations, and thus are not intended to portray the specific dimensions of the various embodiments.

DETAILED DESCRIPTION

Embodiments will now be described more fully with reference to the accompanying drawings. This invention may, however, be embodied in various forms and should not be construed as being limited to the embodiments set forth herein.

Semiconductor apparatus are provided in which patterned regions of a polycrystalline aromatic organic semiconductor are grown on a substrate. The patterning is directed by materials applied to the substrate to either promote or inhibit nucleation of crystals of the organic semiconductor. The material that promotes nucleation of the aromatic semiconductor comprises an aromatic moiety that can interact with the aromatic semiconductor. In exemplary embodiments the material that inhibits nucleation of the aromatic semiconductor comprises a non-aromatic moiety or an aromatic moiety having insufficient conjugated pi-electrons, that can interact with the aromatic semiconductor.

FIG. 1 shows an exemplary embodiment 100 of two thin film transistors generally indicated at 102 and 104. Thin film transistor 102 comprises a source electrode 106 and a drain electrode 108 in a spaced apart arrangement on a dielectric layer 110. The source electrode 106 and drain electrode 108 are fabricated from a composition to which a thiol moiety can bond, such as a composition comprising gold, silver, platinum, palladium, copper, or alloys of such elements. Thin film transistor 104 comprises a source electrode 112 and a drain electrode 114 fabricated from the same materials in a spaced apart arrangement on dielectric layer 110. A surface of each of the source electrodes 106 and 112 and of the drain electrodes 108 and 114 is centrally provided with semiconductor crystal nucleation augmentation regions 116, 120, 118 and 122, respectively constituted by a coating composition comprising a compound having a thiol moiety the electrodes and an aromatic moiety positioned to interact with a subsequently applied aromatic semiconductor. The aromatic moiety is so positioned because it is not bonded to the electrodes, whereas the thiol moiety is bonded to one of the electrodes. The surface of each of the source electrodes 106 and 112 and of the drain electrodes 108 and 114 is at each end further provided with semiconductor crystal nucleation inhibition regions 124 and 126, 132 and 134, 128 and 130, and 136 and 138 respectively constituted by a coating composition comprising a compound having a thiol moiety that can bond to the electrodes and a non-aromatic moiety positioned to interact with a subsequently applied aromatic semiconductor. The non-aromatic moiety is so positioned because it is not bonded to the electrodes, whereas the thiol moiety is bonded to one of the electrodes. Polycrystalline semiconductor layer 140 is on the dielectric layer 110 and on semiconductor nucleation augmentation regions 116 and 118, forming a channel region of transistor 102 having a high charge carrier mobility. Polycrystalline semiconductor layer 142 is on the dielectric layer 110 and on semiconductor nucleation augmentation regions 120 and 122, forming a channel region of transistor 104 having a high charge carrier mobility. The polycrystalline semiconductor layers 140 and 142 are formed by interaction of the semiconductor with the aromatic moieties of semiconductor crystal nucleation augmentation regions 116–122 upon semiconductor application.

FIG. 2 shows a cross-sectional view of the exemplary embodiment 100 of thin film transistors 102 and 104, taken on line 2—2 in FIG. 1. Source electrodes 106 and 112, and drain electrodes 108 and 114, are supported on dielectric layer 110. Dielectric layer 110 is supported on a gate electrode 144. The gate electrode 144 is supported on a supporting substrate 146. Semiconductor crystal nucleation augmentation region 116 of source electrode 106, semiconductor crystal nucleation augmentation region 118 of drain electrode 108, semiconductor crystal nucleation augmentation region 120 of source electrode 112, and semiconductor crystal nucleation augmentation region 122 of drain electrode 114, each is constituted by a coating composition comprising an aromatic moiety. Semiconductor layer 140 is on source electrode 106, drain electrode 108, and dielectric layer 110. Semiconductor layer 142 is on source electrode 112, drain electrode 114, and dielectric layer 110. The source electrodes 106 and 112, drain electrodes 108 and 114, and gate electrode 144 are in communication with an electrical circuit, not shown, of which thin film transistors 102 and 104 form a part.

Referring to FIG. 2, semiconductor crystal nucleation augmentation regions 116–122 are formed of dielectric materials that promote nucleation of the selected semiconductor, resulting in formation of semiconductor layers 140 and 142, respectively. If the semiconductor crystal nucleation augmentation regions 116–122 are too thick, injection of a charge into the semiconductor layers 140 and 142 may be difficult. Therefore, desirably in one embodiment, semiconductor crystal nucleation augmentation regions 116–122 have a thickness t that is no greater than about 5 nanometers. The semiconductor crystal nucleation augmentation regions 116–122 promote formation of semiconductor crystal nuclei on their surfaces, which then grow together forming semiconductor layers 140 and 142 constituting channel regions for the transistors 102 and 104. At the same time, semiconductor nucleation inhibition regions 124–138 allow substantially less or virtually no nucleation of the selected semiconductor. In one embodiment, the semiconductor nucleation inhibition regions 124–138 are omitted. However, such omission may permit the random nucleation of semiconductor crystals on the electrodes. In another embodiment, the electrodes 106, 108, 112, and 114 are embedded in the dielectric layer 110 so that the semiconductor layers 140 and 142 are substantially flush with the surface 111 of the dielectric layer 110. The electrodes 106, 108, 112, and 114 can be so embedded by etching the dielectric layer 110 prior to their deposition.

In operation of the exemplary thin film transistor 102, a voltage applied to the gate electrode 144 can be used to control a flow of charge carriers between the source electrode 106 and the drain electrode 108. Similarly, in operation of the exemplary thin film transistor 104, a voltage applied to the gate electrode 144 can be used to control a flow of charge carriers between the source electrode 112 and the drain electrode 114. The portion of the gate electrode 144 underlying exemplary thin film transistor 102 may be separated and electrically isolated from the portion of the gate electrode 144 underlying exemplary thin film transistor 104. In thin film transistor 102, charge carriers are transported between the source electrode 106 and the drain electrode 108 through the semiconductor layer 140. Similarly in thin film transistor 104, charge carriers are transported between the source electrode 112 and the drain electrode 114 through the semiconductor layer 142.

FIG. 3 shows an exemplary embodiment 300 of two thin film transistors generally indicated at 302 and 304. Thin film transistor 302 comprises a source electrode 306 and a drain electrode 308 in a spaced apart arrangement on a dielectric layer 310. Thin film transistor 304 comprises a source electrode 312 and a drain electrode 314 in a spaced apart arrangement on dielectric layer 310. Dielectric layer 310 is fabricated from a material comprising silicon, such as $SiO_2$ or an alkyl siloxane. Siloxanes are compounds that have the general formula $SiOR_1R_2R_3$, in which $R_1$, $R_2$, and $R_3$ can each independently be selected from the group consisting of: Cl, —O—$CH_3$, —O—$CH_2CH_3$, or R in which R is a hydrocarbon moiety such as an alkyl group for example. Background information regarding such dielectric layers is provided in Collet, J., et al., "High Anisotropic Conductivity in Organic Insulator/Semiconductor Monolayer Heterostructure," Applied Physics Letters, Vol. 76, No. 10, pp. 1339–1341, Mar. 6, 2000, the entirety of which is hereby incorporated herein by reference.

A portion of the dielectric layer 310 that is centrally located between the source electrode 306 and the drain electrode 308 of transistor 302 is provided with semiconductor crystal nucleation augmentation region 316 thereon, constituted by a coating of a composition comprising aromatic moieties and comprising moieties containing reactive silicon atoms, such as $SiCl_3$ groups or $SiOR_3$ groups. A portion of the dielectric layer 310 that is centrally located between the source electrode 312 and the drain electrode 314 of transistor 304 is provided with semiconductor crystal nucleation augmentation region 318 thereon, also constituted by a coating of a composition comprising aromatic moieties and comprising moieties containing reactive silicon moieties, such as $SiCl_3$ groups or $SiOR_3$ groups. The moieties of such coatings that comprise reactive silicon atoms, such as $SiCl_3$ groups or $SiOR_3$ groups, are chemically attracted to and become juxtaposed to the silicon in dielectric layer 310. The aromatic moieties of such coatings are not so attracted and accordingly become positioned facing away from the dielectric layer 310. If the semiconductor crystal nucleation augmentation regions 316 and 318 are too thick, injection of a charge into the respective semiconductor layers 326 and 328 may be difficult. Therefore, desirably in one embodiment, semiconductor crystal nucleation augmentation regions 316 and 318 have a thickness h that is no greater than about 5 nanometers.

The portion of the dielectric layer 310 excluding the semiconductor crystal nucleation augmentation regions 316 and 318 is provided with a coextensive semiconductor crystal nucleation inhibition region 320 constituted by a coating of a composition comprising non-aromatic moieties and comprising moieties containing reactive silicon atoms, such as $SiCl_3$ groups or $SiOR_3$ groups. The moieties of such coatings that comprise reactive silicon atoms, such as $SiCl_3$ groups or $SiOR_3$ groups, are chemically attracted to and become juxtaposed to the silicon in dielectric layer 310. The non-aromatic moieties of such coatings are not so attracted and accordingly become positioned facing away from the dielectric layer 310. Together, the regions 316, 318 and 320 define a patterned coating on the dielectric substrate 310, in which a coating comprising aromatic groups is only provided in the semiconductor crystal nucleation augmentation regions 316 and 318. A polycrystalline semiconductor is on the semiconductor crystal nucleation augmentation regions 316 and 318 of transistors 302 and 304, respectively, and makes contact with the source and drain electrodes forming channel regions having a high charge carrier mobility.

FIG. 4 shows a cross-sectional view of the exemplary embodiment 300 of thin film transistors 302 and 304, taken on line 4—4 in FIG. 3. Source electrodes 306 and 312, and drain electrodes 308 and 314 are supported on dielectric layer 310. Dielectric layer 310 is supported on a gate electrode 322. The gate electrode 322 is supported on a supporting substrate 324. Semiconductor crystal nucleation augmentation regions 316 and 318 of transistors 302 and 304, respectively, are supported on the dielectric layer 310 and constituted by coatings of a composition comprising aromatic moieties and comprising moieties containing reactive silicon atoms, such as $SiCl_3$ groups or $SiOR_3$ groups. A semiconductor layer 326 is in contact with source electrode 306, drain electrode 308, and is on the semiconductor crystal nucleation augmentation region 316. A semiconductor layer 328 is in contact with source electrode 312, drain electrode 314, and is on the semiconductor crystal nucleation augmentation region 318. Semiconductor crystal nucleation inhibition regions 330, 332 and 334 collectively form the semiconductor nucleation inhibition region 320 on the dielectric layer 310 and are constituted by coatings of a composition comprising non-aromatic moieties and comprising moieties containing reactive silicon atoms, such as $SiCl_3$ groups or $SiOR_3$ groups. The source electrodes 306 and 312, drain electrodes 308 and 314, and gate electrode 322 are in communication with an electrical circuit, not shown, of which thin film transistors 302 and 304 form a part. In another embodiment, the electrodes 306, 308, 312 and 314 are embedded in the dielectric layer 310 so that the semiconductor layers 326 and 328 are substantially flush with the surface 311 of the dielectric layer 310.

Referring to FIG. 4, semiconductor crystal nucleation augmentation regions 316 and 318 are formed of dielectric materials comprising aromatic moieties that promote nucleation of the selected aromatic organic semiconductor, forming semiconductor regions 326 and 328 constituting channel regions for the transistors 302 and 304. At the same time, semiconductor nucleation inhibition region 320 constituted by semiconductor crystal nucleation inhibition regions 330, 332 and 334, allows substantially less or virtually no nucleation of the selected aromatic organic semiconductor. In one embodiment, the semiconductor nucleation inhibition region 320 is omitted. However, such omission may permit the random nucleation of semiconductor crystals on the dielectric substrate 310.

In another embodiment, a surface of each of the source electrodes 106 and 112 and of the drain electrodes 108 and 114 shown in FIG. 4 is centrally provided, as discussed above in connection with FIGS. 1 and 2, with semiconductor crystal nucleation augmentation regions 116, 118, 120 and 122, constituted by coatings of a composition comprising a thiol moiety that can bond to the electrodes and an aromatic moiety positioned to interact with a subsequently applied aromatic semiconductor. Further as discussed above in connection with FIGS. 1 and 2, the surface of each of the source electrodes 106 and 112 and of the drain electrodes 108 and 114 is at each end further provided with semiconductor crystal nucleation inhibition regions 124 and 126, 132 and 134, 128 and 130, and 136 and 138, constituted by a coating of a composition comprising a thiol moiety that can bond to the electrodes and a non-aromatic moiety positioned to interact with a subsequently applied aromatic semiconductor. In this manner, the semiconductor crystal nucleation augmentation regions 316 and 318 shown in FIG. 3, and the semiconductor crystal nucleation augmentation regions 116, 118, 120 and 122 shown in FIG. 1, collectively constitute a patterned region that promotes nucleation of crystals of the aromatic organic semiconductor. Further, the semiconductor crystal nucleation inhibition region 320 shown in FIG. 3, and the semiconductor crystal nucleation inhibition regions 124–138 shown in FIG. 1, collectively constitute a patterned region that inhibits nucleation of crystals of the aromatic organic semiconductor.

In operation of the exemplary thin film transistor 302, a voltage applied to the gate electrode 322 can be used to control a flow of charge carriers between the source electrode 306 and the drain electrode 308. Similarly, in operation of the exemplary thin film transistor 304, a voltage applied to the gate electrode 322 can be used to control a flow of charge carriers between the source electrode 312 and the drain electrode 314. The portion of the gate electrode 322 underlying exemplary thin film transistor 302 may be separated and electrically isolated from the portion of the gate electrode 322 underlying exemplary thin film transistor 304. In thin film transistor 302, charge carriers are transported between the source electrode 306 and the drain electrode 308 through the semiconductor layer 326. Similarly in thin film transistor 304, charge carriers are transported between the source electrode 312 and the drain electrode 314 through the semiconductor layer 328.

FIG. 5 shows an exemplary embodiment 500 of two thin film transistors generally indicated at 502 and 504. Thin film transistor 502 comprises a source electrode 506 and a drain electrode 508 in a spaced apart arrangement on a semiconductor layer 510. Thin film transistor 504 comprises a source electrode 512 and a drain electrode 514 in a spaced apart arrangement on a semiconductor layer 516. Transistors 502 and 504 are supported by a dielectric layer 518 fabricated from a material comprising silicon, such as $SiO_2$ or a siloxane.

FIG. 6 shows a cross-sectional view of the exemplary embodiment 500 of thin film transistors 502 and 504, taken on line 6—6 in FIG. 5. Source electrode 506 and drain electrode 508 of transistor 502 are on semiconductor layer 510. Source electrode 512 and drain electrode 514 of transistor 504 are on semiconductor layer 516. Semiconductor layer 510 is on semiconductor crystal nucleation augmentation region 520, such augmentation region constituted by a coating of a composition comprising aromatic moieties and comprising moieties containing reactive silicon atoms, such as $SiCl_3$ groups or $SiOR_3$ groups. Semiconductor layer 516 is on semiconductor crystal nucleation augmentation region 522, such augmentation region being constituted by a coating of a composition comprising aromatic moieties and comprising moieties containing reactive silicon atoms, such as $SiCl_3$ groups or $SiOR_3$ groups. The semiconductor crystal nucleation augmentation regions 520 and 522 are on dielectric layer 518. The moieties of the coatings that comprise reactive silicon atoms, such as $SiCl_3$ groups or $SiOR_3$ groups, are chemically attracted to and become juxtaposed to the silicon in dielectric layer 518. The aromatic moieties of the coatings are not so attracted and accordingly become positioned facing away from the dielectric layer 518. If the semiconductor crystal nucleation augmentation regions 520 and 522 are too thick, injection of a charge into the semiconductor layers 510 and 516 may be difficult. Therefore, desirably in one embodiment, semiconductor crystal nucleation augmentation regions 520 and 522 have a thickness d that is no greater than about 5 nanometers.

Surrounding the semiconductor crystal nucleation augmentation regions 520 and 522 are semiconductor crystal nucleation inhibition regions 524, 526 and 528, constituted by a coating comprising non-aromatic moieties and comprising moieties containing reactive silicon atoms, such as $SiCl_3$ groups or $SiOR_3$ groups. The moieties of such coating that comprise reactive silicon atoms, such as $SiCl_3$ groups or $SiOR_3$ groups, are chemically attracted to and become juxtaposed to the silicon in dielectric layer 518. The non-aromatic moieties of such coatings are not so attracted and accordingly become positioned facing away from the dielectric layer 518. Semiconductor crystal nucleation inhibition regions 524, 526 and 528 collectively form a semiconductor crystal nucleation inhibition region 530 shown in FIG. 5 on those portions of dielectric layer 518 not supporting the semiconductor crystal nucleation augmentation regions 520 and 522. Together, the regions 520, 522, 524, 526, and 528 define a patterned coating on the dielectric substrate 518, in which a coating comprising aromatic groups is only provided in the semiconductor crystal nucleation augmentation regions 520 and 522. The semiconductor crystal nucleation augmentation regions 520 and 522 promote formation of semiconductor crystal nuclei on their surfaces. At the same time, semiconductor nucleation inhibition region 530 allows substantially less or virtually no nucleation of the selected aromatic organic semiconductor to occur. The semiconductor layer 510 on the semiconductor crystal nucleation augmentation region 520 makes contact with the source electrode 506 and the drain electrode 508, forming a channel region having a high charge carrier mobility. The semiconductor layer 516 on the semiconductor crystal nucleation augmentation region 522 makes contact with the source electrode 512 and the drain electrode 514, forming a channel region having a high charge carrier mobility. In one embodiment, the semiconductor nucleation inhibition region 530 is omitted. However, such omission may permit the random nucleation of semiconductor crystals on the dielectric substrate 518. Dielectric layer 518 is supported on a gate electrode 532. The gate electrode 532 is supported on a supporting substrate 534. The source electrodes 506 and 512, drain electrodes 508 and 514, and gate electrode 532 are in communication with an electrical circuit, not shown, of which thin film transistors 502 and 504 form a part.

In operation of the exemplary thin film transistor 502, a voltage applied to the gate electrode 532 can be used to control a flow of charge carriers between the source electrode 506 and the drain electrode 508. Similarly, in operation of the exemplary thin film transistor 504, a voltage applied to the gate electrode 532 can be used to control a flow of charge carriers between the source electrode 512 and the drain electrode 514. The portion of the gate electrode 532 underlying exemplary thin film transistor 502 may be separated and electrically isolated from the portion of the gate electrode 532 underlying exemplary thin film transistor 504. In thin film transistor 502, charge carriers are transported between the source electrode 506 and the drain electrode 508 through the semiconductor layer 510. Similarly in thin film transistor 504, charge carriers are transported between the source electrode 512 and the drain electrode 514 through the semiconductor layer 516.

FIGS. 1–6 as discussed above relate to exemplary and non-limiting embodiments. For example, the embodiments shown in FIGS. 1–6 each show two thin film transistors. Other embodiments can comprise any desired quantity of thin film transistors. For example, the thin film transistors can be incorporated into an integrated circuit. Other designs for thin film transistors can be employed.

Further embodiments according to the invention will be discussed below in connection with thin film transistors. However, it is to be understood that the teachings herein can be further extended to devices other than thin film transistors that require lateral patterning of a semiconductor into discrete regions. For example, diodes can be produced in an analogous manner. Other exemplary semiconductor electronic devices that can be fabricated by use of the teachings herein include light emitting devices, photodetecting devices, photovoltaic cells, photoconductive cells, photoresistive cells, photodiodes, and photoswitches.

Appropriate compositions for forming coatings to constitute semiconductor crystal nucleation augmentation regions and semiconductor nucleation inhibition regions to be employed in making thin film transistors are selected depending upon the composition of the aromatic organic semiconductor to be employed and the composition of the substrate on which they are to be deposited. In one embodiment, coatings are applied to source and drain electrodes fabricated from a composition comprising gold, silver, platinum, palladium, copper, or alloys of such elements. Thiol compounds form strong bonds to these elements. Hence, the composition can be provided with thiol groups to facilitate both the bonding of the composition to the source and drain electrodes, and to facilitate orientation of the other moieties of the composition away from the surfaces of the source and drain electrodes where they can interact with a subsequently applied aromatic organic semiconductor. In another embodiment, coatings are applied to a dielectric layer comprising silicon, such as $SiO_2$ or a siloxane. Such a dielectric layer is susceptible to interaction with moieties containing reactive silicon atoms, such as $SiCl_3$ groups or $SiOR_3$ groups. R can be, for example, methyl or ethyl. Hence, the composition can be provided with moieties containing $SiCl_3$ groups or $SiOR_3$ groups to facilitate both the bonding of the composition to the source and drain electrodes, and to facilitate orientation of the other moieties of the composition away from the surfaces of the source and drain electrodes where they can interact with a subsequently applied aromatic organic semiconductor. The composition of the aromatic organic semiconductor to be used is taken into account in selecting the structure of the moieties of the coating compositions intended to interact with the subsequently applied aromatic organic semiconductor. The composition for forming coatings to constitute semiconductor crystal nucleation augmentation regions further comprises aromatic moieties, which when oriented away from the coating substrate are able to interact with and promote nucleation of the subsequently applied aromatic semiconductor. In one embodiment, such aromatic moieties are selected to have a number of conjugated aromatic pi-electrons that is at least as large as the same number of conjugated aromatic pi-electrons present in the selected aromatic semiconductor minus eight such pi-electrons (hereinafter an "influential amount" of pi-electrons). In another embodiment, such aromatic moieties are selected to have a number of conjugated aromatic pi-electrons that is an influential amount at least as large as the same number of conjugated aromatic pi-electrons present in the selected aromatic semiconductor minus two such pi-electrons. The composition for forming coatings to constitute semiconductor crystal nucleation inhibition regions further comprises non-aromatic moieties, which when oriented away from the coating substrate are able to interact with and inhibit nucleation of the subsequently applied aromatic semiconductor. Alternatively, the composition for forming coatings to constitute semiconductor crystal nucleation inhibition regions further comprises a number of conjugated aromatic pi-electrons that is no greater than the same number of conjugated aromatic pi-electrons present in the selected aromatic semiconductor minus eight such pi-electrons (hereinafter a "non-influential amount" of pi-electrons).

In embodiments where thiol compounds are used, the thiol group forms a covalent bond to the electrodes fabricated from gold, silver, platinum, palladium, copper, or an alloy. Hence, if the molecules of the compound are placed in patterned contact with the gold electrode, they will orient themselves with the thiol moieties facing the gold electrode and then form covalent thio bonds anchoring the molecules in the desired pattern to the gold electrode. The position of such thiol groups on the compound can be selected to maximize the effectiveness of the resulting semiconductor crystal nucleation augmentation and inhibition regions. For example, the thiol groups can be located at an extreme end of a longitudinal axis of molecules of the compound, so that the resulting bound molecules are oriented perpendicular to the surface of the electrode. In this manner, a highly ordered self-assembled monolayer of molecules of the compound can be prepared on patterned regions of the electrode. Compounds having multiple thiol groups are less preferred for use with regard to preparing semiconductor crystal nucleation augmentation regions, as the resulting multiple bonding sites between the molecules and the gold electrode degrade the ordered assembly of the monolayer and of the resulting nucleation sites for the aromatic organic semiconductor.

In embodiments where compounds containing reactive silicon atoms, such as $SiCl_3$ groups or $SiOR_3$ groups are used, the silicon-containing group forms a covalent bond to the dielectric layer comprising silicon. Hence, if the molecules of the compound are placed in patterned contact with the dielectric layer, they will orient themselves with the silicon-containing moieties facing the dielectric substrate and then form covalent bonds anchoring the molecules in the desired pattern to the dielectric substrate. The position of such silicon-containing groups on the compound can be selected to maximize the effectiveness of the resulting semiconductor crystal nucleation augmentation and inhibition regions. For example, the silicon-containing groups can be located at an extreme end of a longitudinal axis of molecules of the compound, so that the resulting bound molecules are oriented perpendicular to the surface of the electrode. In this manner, a highly ordered self-assembled monolayer of molecules of the compound can be prepared on patterned regions of the electrode. Compounds having multiple silicon-containing groups are less preferred for use with regard to preparing semiconductor crystal nucleation augmentation regions, as the resulting multiple bonding sites between the molecules and the dielectric substrate degrade the ordered assembly of the monolayer and of the resulting nucleation sites for the aromatic organic semiconductor.

Once nucleation of the semiconductor is established on the substrate surface, semiconductor crystals can then grow from the semiconductor nuclei. As a result, discrete polycrystalline semiconductor regions generally grow in a patterned array as desired, separated by regions that are either substantially devoid of semiconductor deposits, or that are characterized by relatively small and isolated crystals. In this manner, an aromatic organic semiconductor can be applied to the substrate in a desired pattern to form thin film transistors.

For an exemplary p-type semiconductor capable of transporting holes, electrical conductivity is approximated by the formula $\sigma=en\ \mu_d$ where $\mu_d$ is the carrier mobility, e is the charge on the carriers, and n is the density of free carriers. Conductivity accordingly is proportional to mobility. Mobility can readily be measured, and the corresponding conductivity can be approximated. Conductivity in a device comprising an aromatic organic semiconductor depends on the size and separation of crystal grains. The size distribution of crystal grains determines how many of them must be effectively traversed by a charge carrier in order to be transported from an origin to a destination such as between a source and drain, for example. The separation between crystal grains determines the impact of non-crystalline regions on conductivity. For example, crystal grains separated by a distance greater than the maximum inter-grain tunneling distance for a particular semiconductor material may constitute a non-conductive pathway for charge carriers. Conductivity within a crystal grain of an organic semiconductor also depends on charge carrier energy levels and molecular overlaps in the crystal.

One aromatic organic semiconductor that can be used is tetracene. Tetracene is a linear acene having four aromatic rings. Films of tetracene are capable of conductive transport by holes. For example, a polycrystalline film of tetracene generally provides a low mobility, within a range between about $10^{-5}$ cm$^2$/Vs and about 0.01 cm$^2$/Vs at room temperature. In contrast, where crystallization of tetracene is promoted, mobilities within a range between about 0.1 cm$^2$/Vs and about 1 cm$^2$/Vs at room temperature can be achieved.

In one embodiment, monochlorotetracene is used as the aromatic organic semiconductor. The chlorine atom may, for example, be bonded to one of the interior benzene rings of the molecule. Tetracene is not readily dissolved in common solvents. The solubility of tetracene in methylene chloride is about 0.125 mg/ml; and the solubility of monochlorotetracene in methylene chloride is about 25 mg/ml. Hence, monochlorotetracene has a much higher solubility, relatively about 200 times greater in methylene chloride for example, thus allowing for increased crystal formation from solution. Alternatively, tetracene having another substituent such as an alkyl or halogen moiety can be used. In general, non-aromatic substituents on aromatic semiconductor molecules disrupt pi-bonding and can be employed to thus decrease the ability of molecules to stack together in a lattice and to prematurely crystallize. In this embodiment, the composition of the compound for the coating to constitute semiconductor crystal nucleation augmentation regions is selected to have an influential amount of pi-electrons. In one embodiment, the composition of the compound for the coating to constitute semiconductor crystal nucleation augmentation regions comprises a triphenyl group, in which, for example, the phenyl groups may be mutually para-bonded. In this embodiment, one of the phenyl groups in the compound can include a thiol group to facilitate bonding of the compound to a gold substrate. For this purpose, for example, the coating compound for forming the semiconductor crystal nucleation augmentation regions may be a triphenylthiol. Further in this embodiment, one of the phenyl groups in the compound can include a $SiCl_3$ group or a $SiOR_3$ group to facilitate bonding to a dielectric layer comprising silicon. For this purpose, for example, the coating composition for forming the semiconductor crystal nucleation augmentation regions may comprise triphenyl-trichlorosilane or triphenyl-triethoxysilane. In another embodiment, anthracene is used as the aromatic organic semiconductor. In this embodiment, the composition of the compound for the coating to constitute semiconductor crystal nucleation augmentation regions is selected to have an influential amount of pi-electrons.

In the preceding embodiments regarding chlorotetracene and anthracene, the composition of the coating for forming the semiconductor crystal nucleation inhibition regions generally has a non-influential amount of pi-electrons. In one embodiment regarding chlorotetracene and anthracene, the composition of the coating for forming the semiconductor crystal nucleation inhibition regions comprises an exemplary compound comprising a moiety selected from the group including: biphenyl, phenyl, alkane, carboxylic acid, fluorinated hydrocarbon, and propyl amine. Accordingly, exemplary compounds for use in coatings for forming the semiconductor crystal nucleation inhibition regions on gold electrodes include: biphenylthiol, benzylthiol, dodecanethiol, $NH_2$—$(CH_2)_3SH$ and $HOOC$—$(CH_2)_{11}$—$SH$. Further, exemplary compounds for use in coatings for forming the semiconductor crystal nucleation inhibition regions on a dielectric layer comprising silicon include: biphenyl-trichlorosilane, biphenyl-triethoxysilane, phenyl-trichlorosilane, phenyl-triethoxysilane, dodecane-trichlorosilane, dodecane-triethoxysilane, $NH_2$—$(CH_2)_3Si$—$(OR)_3$, $HOOC$—$(CH_2)_{11}Si$—$(OR)_3$, $NH_2$—$(CH_2)_3Si$—$Cl_3$, and $HOOC$—$(CH_2)_{11}SiCl_3$.

It will be understood that the teachings herein likewise extend to other aromatic semiconductors and to mixed aromatic semiconductors. In further exemplary embodiments, a bithiophene such as 5,5'-bis-(4-ethylphenyl)2,2'-bithiophene or 5,5'-bis-(8-hexylfluorine-1-yl)2,2'-bithiophene is employed as the semiconductor. In additional exemplary embodiments, a thiophene such as sexithiophene or a benzothiophene dimer is employed as the semiconductor. Further exemplary thiophene compounds that can be used include: 2,5-linked thiophene tetramers, pentamers, and hexamers, either unsubstituted or substituted at the terminal 5 positions with linear alkyl or alkoxyalkyl chains of about 4 to about 12 atoms in length; anthradithiophene and terminal dialkyl derivatives thereof, including for example dihexylanthradithiophene; regioregular poly (3-hexylthiophene); and co-oligomers of 2,5-linked thiophene rings and 1,4-linked benzene rings about 5 rings long, either unsubstituted or substituted as described for the thiophene oligomers, including for example 1,4-bis(5-(5-hexylthien-2-yl)thien-2-yl)benzene (DHT4Ph). DHT4Ph can be synthesized according to procedures described for hexylated 5- and 6-ring compounds in W. Li et al, Chem. Mater., Vol. 11, page 458 (1999), the entirety of which is hereby incorporated herein, using 1,4-diiodobenzene as the source of the benzene ring. Other substituted and unsubstituted acenes such as anthracene, pentacene and hexacene for example, other bithiophenes, other thiophenes, phthalocyanines including for example copper phthalocyanine and perfluorinated copper phthalocyanine, naphthalene-1,4,5,8-tetracarboxylic diimide compounds, naphthalene-1,4,5,8-tetracarboxylic dianhydride, and 11,11,12,12-tetracyanonaphtho-2,6-quinodimethane, for example, can also be used. See, for example, Dimitrakopoulos et al. U.S. Pat. No. 5,981,970, Bauntech, et al. U.S. Pat. No. 5,625,199, Garnier, et al. U.S. Pat. No. 5,347,144, and Klauck, Hagen et al., "Deposition: Pentacene organic thin-film transistors and ICs," Solid State Technology, Vol. 43, Issue 3, March 2, on pp. 63–75. The entirety of the foregoing patents and article cited in this paragraph are hereby incorporated herein by reference in their entirety.

Pentacene is a particularly desirable organic semiconductor, because single crystals can be made having mobilities within a range between about 1 $cm^2/Vs$ and about 5 $cm^2/Vs$ at room temperature. However, pentacene is not readily dissolved in common solvents. In one embodiment, a pentacene derivative having enhanced solubility in a solvent, such as chloropentacene, is employed as the semiconductor. Further for example, tetramethylpentacene or tetraethylpentacene can be used. In another embodiment, a soluble pentacene precursor is employed as the semiconductor and later converted into pentacene itself. Pentacene precursors are disclosed, for example, in Dimitrakopoulos et al. U.S. Pat. No. 5,981,970.

It will be understood that the teachings herein likewise extend to other coating compositions to constitute the semiconductor crystal nucleation augmentation regions. In one embodiment, the composition used to make the semiconductor nucleation augmentation regions comprises a compound comprising an aromatic moiety having at least three aromatic rings with conjugated pi-bonding. In another embodiment, the compound comprising an aromatic moiety comprises at least three mutually connected benzene rings, with a thiol or reactive silicon-containing group as explained above, located at an extremity of the compound molecule. The benzene rings may either be mutually bridged through alkyl bonds, or fused. The benzene rings may either be mutually oriented in a straight chain and bonded through para positions, or may include branching and non-para bonding. For example, oligo(para-phenylenes) such as para-terphenyl, para-quaterphenyl, para-pentaphenyl, and para-sexiphenyl can be used. Para-terphenyl and para-quaterphenyl are commercially available from Sigma-Aldrich. Para-sexiphenyl is commercially available from Tokyo Kasei Kogyo Co. Ltd. In further embodiments, non-aromatic regions may be interposed between the aromatic region of the compound and the thiol or reactive silicon group. For example, a straight- or branched-chain hydrocarbon group that is saturated or unsaturated in whole or part, or also containing alicyclic moieties in whole or part, having between 0 and about 16 carbon atoms, can be so used. In further embodiments, a monothiolated acene or an acene comprising a reactive silicon group, and comprising at least three aromatic rings is employed as the aromatic compound. For example, the acene may be anthracene, tetracene or pentacene. In further embodiments, benzene rings in the foregoing compounds are substituted in whole or part by other aromatic systems such as pyridine or pyrrole moieties. Desirably, the use of mixtures of compounds is avoided as typically they will not form ordered self-assembled monolayers.

It will be understood that the teachings herein likewise extend to other coating compositions to constitute the semiconductor crystal nucleation inhibition regions. The compound may comprise aliphatic or alicyclic moieties, for example, and the compound is designed so that the non-aromatic moieties interface with the subsequently applied aromatic semiconductor. In additional embodiments, the compound can comprise further hydrocarbon, heteroatom or other charged or uncharged moieties. For example, a straight- or branched-chain hydrocarbon moiety that is saturated or unsaturated in whole or part, or also containing alicyclic moieties in whole or part, can be used. Alkane thiols and silanes having between 2 and 16 carbon atoms, for example, can be used. Exemplary compounds include undecylthiol, dodecylthiol, undecyl-trichlorosilane, and dodecyl-triethoxysilane. In one embodiment, the composition used to make the semiconductor nucleation inhibition regions comprises a charged group to further decrease the affinity to the aromatic semiconductor. Desirably, such a charged group is positioned at or near a longitudinal end of the compound opposite to the longitudinal end where the thiol or reactive silicon group is located. In one embodiment, a negatively charged carboxylic acid, sulphonate or phosphonate group is so provided on the compound. In another embodiment, a positively charged amino group is so provided on the compound. In additional embodiments, the compound can comprise further hydrocarbon, heteroatom or other charged or uncharged moieties. For example, the compound can be substituted by halogens such as fluorine, such as tridecafluoro-1,1,2,2-tetrahydro-octyl-triethoxysilane, or 4-mercapto-1-fluorobenzene.

In another embodiment, the coating composition to constitute the semiconductor crystal nucleation inhibition regions comprises a compound comprising a plurality of aromatic rings and a thiol or reactive silicon group at one end, and comprising a non-aromatic group at the other end of sufficient mass to shield the aromatic semiconductor from aromatic pi-bonding interactions. In a further embodiment, the coating composition to constitute the semiconductor crystal nucleation inhibition regions comprises molecules of a compound that are deposited in a non-crystalline, random state on the substrate to be patterned.

General procedures for synthesizing thiol-terminated conjugated oligomers are summarized in B. de Boer, H. Meng, D. F. Perepichka, J. Zheng, Y. Chabal, F. Wudl, P. G. Van Patten, and Z. Bao, "Synthesis and Characterization of Conjugated Mono- and Dithiol Oligomers and Characterization of Their Self-Assembled Monolayers", Langmuir, 19, pp. 4272–4284, 2003. General procedures for synthesizing reactive-silicon-terminated compounds with aromatic ends are summarized in Collet, J., et al., "High Anisotropic Conductivity in Organic Insulator/Semiconductor Monolayer Heterostructure," Applied Physics Letters, Vol. 76, No. 10, pp. 1339–1341, Mar. 6, 2000. General procedures for synthesizing $SiCl_3$ and $SiOR_3$ compounds are described in Fritz, G. and Matern, E., "Carbosilanes Synthesis and Reactions," Springer-Verlag, New York, 1986. All of the foregoing documents are hereby incorporated herein in their entirety.

In further embodiments, a dielectric layer comprising aluminum oxide is substituted for the silicon-containing dielectric layers discussed above. In such embodiments, silane groups are replaced by phosphonic acid groups in the compounds to be applied to create patterned regions of semiconductor crystal nucleation augmentation regions and semiconductor nucleation inhibition regions for bonding to the aluminum oxide substrate. In further embodiments, a dielectric layer comprising another metal oxide is substituted for the silicon-containing dielectric layers discussed above. In such embodiments, silane groups are replaced by carboxylic acid groups or —CONHOH groups for bonding to the metal oxide substrate.

In one embodiment, thin film transistors 102 and 104 shown in FIGS. 1 and 2 having chlorotetracene polycrystalline semiconductor regions 140 and 142, respectively, are fabricated by an exemplary method 700 shown in FIG. 7.

Referring to FIG. 7, at step 705 a silicon wafer is provided to serve as the supporting substrate 146 shown in FIG. 2. The silicon wafer provides structural support for the transistors 102 and 104, and has an oxidized dielectric surface comprising silicon dioxide. In alternative embodiments, a supporting substrate composed of other materials is used, or the supporting substrate 146 is omitted.

At step 710, the gate electrode 144 is applied to the supporting substrate 146. The gate electrode 144 can be applied by a variety of conventional methods, such as by sublimation of elemental gold in a vacuum, by electrodeposition, or by electroless deposition. Silicon wafers having preapplied gate electrodes also are commercially available. In further embodiments, the gate electrode 144 is fabricated from another conductive metal such as, for example, silver, platinum, palladium, copper, or alloys of such elements.

At step 715, dielectric layer 110 is provided on the gate electrode 144. To produce the dielectric layer 110, a precursor composition is applied to the gate electrode 144. For example, the selected precursor composition may be dissolved in a solvent and applied to the gate electrode 144 by surface-initiated growth, spin-coating or casting techniques. In the coating and casting techniques, the dielectric layer 110 is converted into a solid form, for example, by drying, polymerizing and/or curing of the selected coated or cast composition. The dielectric layer 110 may be fabricated from any dielectric precursor composition, such as an inorganic or organic composition. The dielectric precursor composition may comprise monomeric, oligomeric or polymeric organic materials, or inorganic materials, and blends of the same. The term "blends" as used in this specification broadly encompasses and includes copolymers formed from the corresponding monomers, oligomers, and polymers, mixtures of polymers, and other compositions comprising the same as well as compositions comprising inorganic materials, however produced. In another embodiment, the dielectric precursor composition comprises an organic compound that is polymerizable to form a dielectric polymer, such as an imide, acrylate, methacrylate, isocyanate, epoxide, vinylsilane, silsesquioxane, cycloalkene or ethacrylate for example.

At step 720, gold source electrodes 106 and 112 and drain electrodes 108 and 114, are provided on the dielectric layer 110. For example, a steel shadow mask can be placed over the surface of the dielectric layer 110, leaving exposed those portions of the surface where the electrodes are to be located. In one embodiment, the gap between source electrode 106 and drain electrode 108, and the gap between source electrode 112 and drain electrode 114, are designed to be as small as possible to facilitate bridged growth of single semiconductor crystals between them on regions 140 and 142. For example, such gaps may be less than about 5 microns in width. The partially formed transistors are then placed in a vacuum chamber such as a bell jar. A source of gold metal is also placed in the vacuum chamber and heated to vaporize and deposit gold over the shadow mask to produce the source electrodes 106 and 112, and drain electrodes 108 and 114. Other materials for fabricating source and drain electrodes can be substituted for gold. For example, silver, platinum, palladium, copper, or alloys of such elements can be used.

At step 725, the exposed surfaces of the gold source electrodes 106 and 112 and drain electrodes 108 and 114 are thoroughly cleaned. For example, the electrodes can be subjected to an aggressive cleaning solution such as a piranha solution. An exemplary piranha solution comprises a 2:1 mixture by volume of sulfuric acid (98% by volume, in water) and hydrogen peroxide (30% by volume, in water). Following exposure to the piranha solution for a moderate time, such as about 5 minutes, the electrodes are thoroughly washed in deionized ultrapure water. Other conventional methods for thoroughly cleaning the electrodes can also be employed.

At step 730, a first thiol compound is transferred to the source electrodes 106 and 112 and drain electrodes 108 and 114 by a soft lithography process. According to this process, an elastomeric stamp is prepared for transfer application of the first thiol compound to the source and drain electrodes. In one embodiment, such an elastomeric stamp is fabricated from polydimethyl siloxane (PDMS). For example, 10 parts of a silicone elastomer base can be thoroughly mixed with one part of a silicone elastomer curing agent to form the stamp. In alternative embodiments, other polymers such as polyurethanes can be used for the stamp. Further background is provided in Y. Xia and G. M. Whitesides, "Soft Lithography", Angew. Chem. Int. Ed. 1998, 37, pp. 550–575, which is hereby incorporated herein in its entirety.

Next, a silicon master wafer is provided having a raised surface that is patterned corresponding to the desired positioning for regions on the source and drain electrodes that will be coated either by semiconductor crystal nucleation augmentation layers or semiconductor nucleation inhibition layers. Such a master wafer can be prepared, for example, by conventional photoresist masking and etching techniques. In alternative embodiments, master wafers composed of other materials can be used. The patterned surface of the silicon master wafer is then treated with a release agent, such as by fluorination, for example. Such fluorination can be carried out by exposing the patterned surface to tridecafluoro-1,1, 2,2-tetrahydrooctyl-tiethoxysilane. The exposure can be carried out for about 15 minutes in the gas phase. In alternative embodiments, other release agents can be used. The PDMS mixture is then poured onto the patterned surface of the silicon master wafer, and the master wafer is then placed in a petri dish and dried in an oven at about 65 degrees centigrade (° C.) for at least about 2 hours. The cured PDMS is then removed from the patterned silicon master wafer with a utility knife. See, for example, Y. Xia and G. M. Whitesides, "Soft Lithography", Angew. Chem. Int. Ed. 1998, 37, pp. 550–575. In alternative embodiments, other methods for applying the selected polymer to the master wafer in order to prepare a transfer stamp can be employed. For example, liquid film casting, spin casting and evaporative film casting can be employed.

A first solution comprising a thiol terminated compound is then loaded onto the PDMS stamp. The first thiol solution can be designed either to generate semiconductor crystal nucleation augmentation regions 116–122, or to generate semiconductor nucleation inhibition regions 124–138. In one embodiment, the first thiol solution includes a solute that is designed to generate semiconductor crystal nucleation augmentation regions 116–122. The solute is a compound comprising an aromatic moiety and a thiol group as discussed above, such as (para-terphenyl)-para-thiol for example. In one embodiment, a 2 millimolar solution of (para-terphenyl)-para-thiol in methylene chloride is prepared. Cotton applicators are submerged in the (para-terphenyl)-para-thiol solution and wiped over the patterned surface of the PDMS stamp. The PDMS stamp is then dried with a stream of nitrogen for at least about 1 minute. The PDMS stamp is then applied once to a receiving surface such as a gold substrate to remove excess (para-terphenyl)-para-thiol. Alternative methods for applying the first thiol to the PDMS stamp include vapor deposition, liquid film casting, and spin casting.

The PDMS stamp is then used to apply a patterned coating of the (para-terphenyl)-para-thiol onto the source electrodes 106 and 112 and the drain electrodes 108 and 114, yielding the desired semiconductor crystal nucleation augmentation regions 116–122. The semiconductor crystal nucleation augmentation regions 116–122 are self-assembled monolayers ("SAM") of (para-terphenyl)-para-thiol molecules desirably having a thickness of one molecule on the source and drain electrodes. The SAM blocks further thiol bonding in the patterned areas on the source and drain electrodes intended to constitute the semiconductor crystal nucleation augmentation regions 116–122. The patterned coating is permitted to remain undisturbed on the source and drain electrodes for at least about 5 minutes. Each such PDMS stamp can be used for several applications, such as about six applications for example. Background information is provided in Y. Xia and G. M. Whitesides, "Soft Lithography", Angew. Chem. Int. Ed. 1998, 37, pp. 550–575.

In alternative embodiments, a patterned coating of the first thiol is applied to the source electrodes 106 and 112 and the drain electrodes 108 and 114 by methods such as ink-jet printing, photolithography, and processes involving direct or indirect transfers from a transfer sheet or web to a desired substrate.

At step 735, the source electrodes 106 and 112 and the drain electrodes 108 and 114 are rinsed and dried. For example, the source and drain electrodes can be rinsed twice with isopropanol and then dried for at least about 30 seconds with a stream of nitrogen.

At step 740, the source electrodes 106 and 112 and the drain electrodes 108 and 114 are exposed to a second thiol. Where the first thiol is designed to generate semiconductor crystal nucleation augmentation regions 116–122, the second thiol is designed to generate semiconductor nucleation inhibition regions 124–138. In one embodiment, the second thiol solution is designed to generate semiconductor nucleation inhibition regions 124–138. In such an embodiment, the second thiol is a compound comprising a thiol group and an exemplary non-aromatic region as discussed earlier, such as dodecylthiol. In one embodiment, a 2 millimolar solution of dodecylthiol in absolute ethanol is prepared. During step 740, the first thiol blocks further thiol bonding in the patterned areas intended to constitute the semiconductor crystal nucleation augmentation regions 116–122. Thus, the second thiol only bonds to the source electrodes 106 and 112 and the drain electrodes 108 and 114 in the remaining areas intended to constitute the semiconductor nucleation inhibition regions 124–138. Accordingly, the source and drain electrodes can be simply immersed in the dodecylthiol solution for a moderate time period such as 30 minutes, to form the semiconductor nucleation inhibition regions 124–138. In one embodiment, the source and drain electrodes are so immersed by dipping them into and pulling them out of the dodecylthiol solution in a direction parallel to their longitudinal axes. The semiconductor nucleation inhibition regions 124–138 are SAMs of dodecylthiol molecules desirably with a thickness of one molecule on the source and drain electrodes. The coatings are permitted to remain undisturbed on the source and drain electrodes for at least about 5 minutes. In alternative embodiments, the second thiol is applied to the source and drain electrodes by methods such as ink jet printing, photolithography, and processes involving direct or indirect transfers from a transfer sheet or web to a desired substrate.

At step 745, the source electrodes 106 and 112 and the drain electrodes 108 and 114 are again rinsed and dried. For example, the source and drain electrodes can be rinsed twice with isopropanol and then dried for at least about 30 seconds with a stream of nitrogen.

At step 750, the source electrodes 106 and 112 and the drain electrodes 108 and 114 are exposed to a solution of a selected aromatic organic semiconductor such as 5-chlorotetracene. In embodiments where a dip-coating method is used to deposit the organic semiconductor, 5-chlorotetracene may provide better solubility than tetracene, so that larger crystals can be made. In embodiments where nucleation is facilitated by soaking the source and drain electrodes in a solution saturated with organic semiconductor, either tetracene or 5-chlorotetracene can be used.

In one embodiment, the selected semiconductor is dissolved by a solvent to form a solution, which is then applied to the semiconductor crystal nucleation augmentation regions 116–122 and to the semiconductor nucleation inhibition regions 124–138 on the source electrodes 106 and 112 and the drain electrodes 108 and 114. For example, where the semiconductor is dissolved in solution, the surfaces of the source and drain electrodes can then be immersed in the solution so that the semiconductor crystallizes out of the solution on the semiconductor crystal augmentation regions to grow a polycrystalline semiconductor. In this manner, semiconductor molecules can interact with the surfaces of the semiconductor crystal nucleation augmentation regions 116–122 until the solvent is removed, such as by evaporation. Deposition of the semiconductor depends on the ability of the regions 116–138 on the source electrodes 106 and 112 and the drain electrodes 108 and 114 to facilitate nucleation. The promoted nucleation over the semiconductor crystal nucleation augmentation regions 116–122 results in a formation of polycrystalline semiconductor regions 140 and 142, respectively. Nucleation of semiconductor crystals directly on the semiconductor crystal nucleation augmentation regions 116–122 leads to growth of such crystals also bridging the gap between source electrode 106 and drain electrode 108, as well as the gap between source electrode 112 and drain electrode 114. The inhibited nucleation over semiconductor nucleation inhibition regions 124–138 results in small amounts of or no crystallization. In this manner, the semiconductor crystal nucleation augmentation regions 116–122 and the semiconductor nucleation inhibition regions 124–138 collectively direct the formation of patterned polycrystalline semiconductor regions 140 and 142.

Where a semiconductor solution is so employed, semiconductor molecules that initially contact one of the semiconductor nucleation inhibition regions 124–138 can flow across the electrode surface, and make contact with one of the semiconductor crystal nucleation augmentation regions 116–122. In this manner, the deposition of the crystalline semiconductor occurs on the desired semiconductor crystal nucleation augmentation regions 116–122 and does not occur on the semiconductor nucleation inhibition regions 124–138. Dissolution of the semiconductor molecules in a solvent promotes the growth of large single semiconductor crystals from the initially formed nuclei. For example, single crystals may be formed having dimensions that span the source and drain electrodes of a thin film transistor.

In another embodiment, the selected semiconductor is applied in a vapor state to the semiconductor crystal nucleation augmentation regions 116–122 and to the semiconductor nucleation inhibition regions 124–138. Vapor deposition is particularly desirable for use with semiconductor oligomers having low solubilities, such as pentacene. In order to avoid nonselective bonding of the semiconductor on contact with the source electrodes 106 and 112 and the drain electrodes 108 and 114, vapor state deposition of semiconductors is generally carried out at a rate of less that 1 angstrom per second (Å/s), more preferably less than 0.5 Å/s and employing low concentrations of the semiconductor suspended in a gaseous vehicle. The vapor deposition rate is proportional to the semiconductor concentration and to the rate of flow of the gaseous suspension. Examples of the experimental details for vapor phase deposition can be found in: Forrest, S. R. Ultrathin Organic Films Grown by Organic Molecular Beam Deposition and Related Techniques. Chem. Rev., Vol. 97, p. 1793 (1997), the entirety of which hereby is incorporated herein by reference. In many cases, however, vapor deposition of an organic semiconductor on a patterned surface may not result in well resolved patterned nucleation.

In one exemplary embodiment, monochlorotetracene semiconductor is dissolved in methylene chloride:chloroform (4:1 by volume) and then applied by dip-coating to the semiconductor crystal nucleation augmentation regions 116–122 and to the semiconductor nucleation inhibition regions 124–138 on the source electrodes 106 and 112 and the drain electrodes 108 and 114. Methylene chloride desirably has a relatively low boiling point to facilitate its removal by evaporation. Other such solvents, such as tetrahydrofuran, can also be used. In one embodiment, the monochlorotetracene is dissolved in methylene chloride to form a 1.1 milligram per milliliter (mg/ml) solution which is then filled into a quartz cuvette. The quartz cuvette is housed in a sealed acrylic chamber to retain constant solvent vapor concentration at room temperature. The partially formed transistors are then submerged in the monochlorotetracene solution, and pulled out of the solution at a constant rate within a range between about 0.01 millimeters per second (mm/sec) and about 0.1 mm/sec. In this manner, semiconductor molecules can interact with the surfaces of the semiconductor crystal nucleation augmentation regions 116–122 until the solvent is removed. The semiconductor crystal nucleation augmentation regions 116–122 and the semiconductor nucleation inhibition regions 124–138 collectively direct the formation of patterned polycrystalline semiconductor regions 140 and 142. The semiconductor coating is permitted to remain undisturbed on the source electrodes 106 and 112 and the drain electrodes 108 and 114 for at least about 5 minutes.

In alternative embodiments, the selected semiconductor can be dissolved in other solvents. In further alternative embodiments, other methods for applying the semiconductor may be employed, such as liquid film casting, spin casting, or evaporative film casting.

At step 755, the completed transistors 102 and 104 are again rinsed and dried. For example, the transistors 102 and 104 can be rinsed twice with isopropanol and then dried for at least about 30 seconds with a stream of nitrogen in a nitrogen box.

Figure 8:
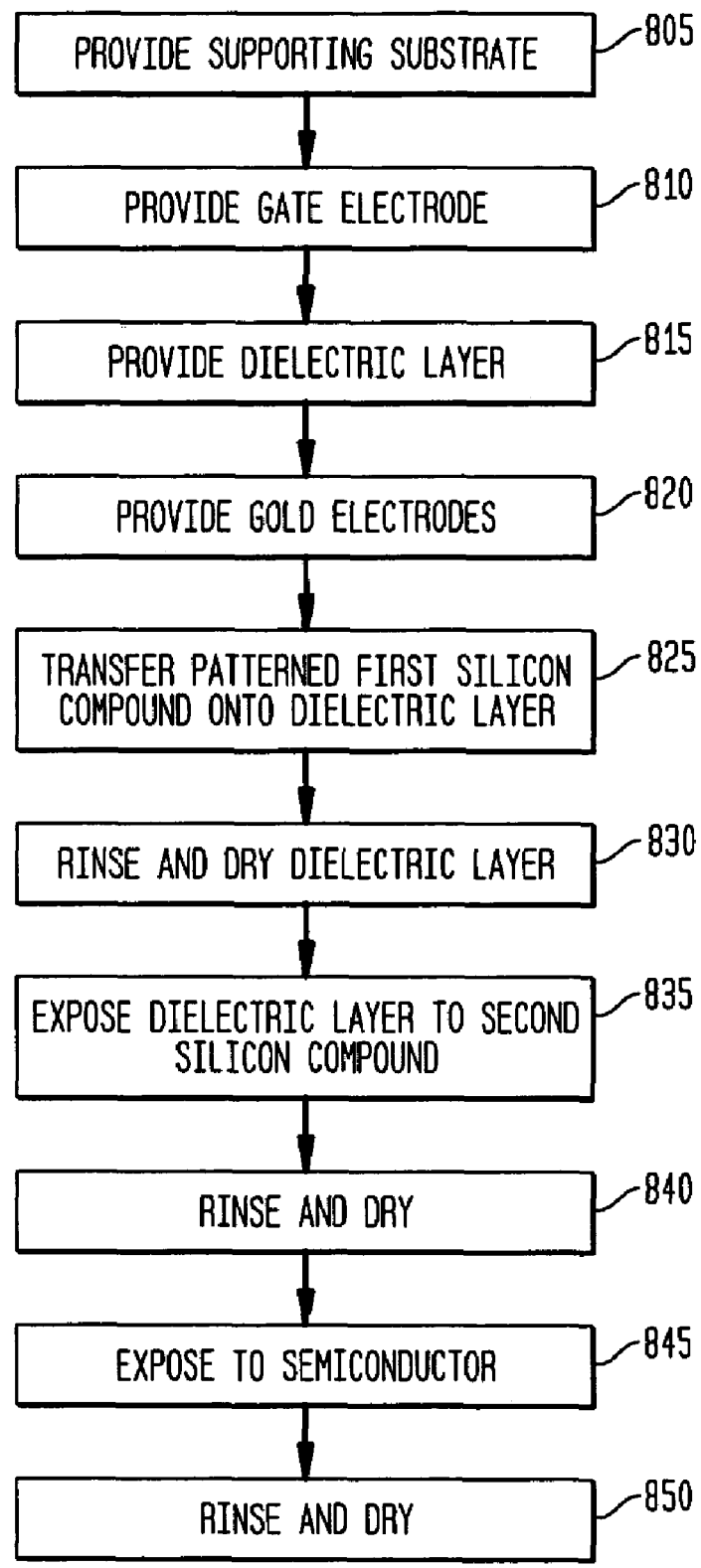
FIG. 8 shows a flow chart for an exemplary method of making the thin film transistors shown in FIGS. 3 and 4.

In another embodiment, thin film transistors 302 and 304 shown in FIGS. 3 and 4 having exemplary chlorotetracene polycrystalline semiconductor regions 316 and 318, respectively, are fabricated by an exemplary method 800 shown in FIG. 8.

Referring to FIG. 8, at step 805 a silicon wafer is provided in the same manner as discussed above in connection with step 705 of FIG. 7, to serve as the supporting substrate 324 shown in FIG. 4. At step 810, the gate electrode 322 is applied to the supporting substrate 324 in the same manner as discussed above in connection with step 710 of FIG. 7. Since thiol bonding is not used in this embodiment, however, the gate electrode, and the source and drain electrodes as further discussed below, can be fabricated if desired from other conductive metals and alloys, as well as conductive plastics and ceramics. At step 815, dielectric layer 310 is provided on the gate electrode 322 in the same manner as discussed above in connection with step 715 of FIG. 7. At step 820, gold source electrodes 306 and 312 and drain electrodes 308 and 314 are provided on the dielectric layer 310 in the same manner as discussed above in connection with step 720 of FIG. 7.

At step 825, a first compound containing reactive silicon atoms, such as $SiCl_3$ groups or $SiOR_3$ groups, is transferred to the dielectric layer 310 by a soft lithography process. According to this process, an elastomeric stamp is prepared in the same manner as discussed above in connection with step 730 of FIG. 7. A first solution comprising a compound containing reactive silicon atoms is then loaded onto the PDMS stamp. The first solution comprising a compound containing reactive silicon atoms can be designed either to generate semiconductor crystal nucleation augmentation regions 316 and 318 shown in FIGS. 3 and 4, or to generate semiconductor nucleation inhibition regions 330, 332 and 334. In one embodiment, the first solution comprises a compound containing reactive silicon atoms that is designed to generate semiconductor crystal nucleation augmentation regions 316 and 318. The solute is a compound comprising an aromatic moiety and a moiety containing reactive silicon atoms as discussed above, such as (para-terphenyl)-para-$SiOR_3$.

In one embodiment, a precursor to a (para-terphenyl)-para-$SiOR_3$ compound is applied in the desired pattern to form semiconductor crystal nucleation augmentation regions 316 and 318 and is then converted in situ to the (para-terphenyl)-para-$SiOR_3$ compound. In one embodiment, a 2 millimolar solution of an alkene-$SiOR_3$ compound such as ethylene-triethoxysilane in methylene chloride is prepared. Cotton applicators are submerged in the ethylene-triethoxysilane solution and wiped over the patterned surface of the PDMS stamp. The PDMS stamp is then dried with a stream of nitrogen for at least about 1 minute. The PDMS stamp is then applied once to a receiving surface such as an $SiO_2$ wafer to remove excess ethylene-triethoxysilane. Alternative methods for applying the first compound containing reactive silicon atoms to the PDMS stamp include vapor deposition, liquid film casting, and spin casting.

The PDMS stamp is then used to apply a patterned coating of the ethylene-triethoxysilane compound onto the dielectric layer 310, yielding precursors to the desired semiconductor crystal nucleation augmentation regions 316 and 318. The terminal double bond of the ethylene moiety in ethylene-triethoxysilane is subsequently converted first by oxidation into a —COOH moiety and second into a —COCl moiety. The oxidation can be carried out, for example, by an aqueous solution of $KMnO_4/NaIO_4/K_2CO_3$. The —COCl moiety is then allowed to react by esterification at room temperature over an extended period such as 120 hours with an alcohol of the formula R—OH, in which R is the desired aromatic moiety for interaction with the organic semiconductor. A water trap can be used to enhance the reaction yield. For example, the alcohol may be hydroxy-(para-terphenyl), so that the semiconductor crystal nucleation augmentation regions 316 and 318 comprise (para-terphenyl)-para-$SiOR_3$. All of the precursor conversion steps can be carried out by simply dipping the dielectric layer 310 into solutions of the appropriate reagents followed by rinsing. The semiconductor crystal nucleation augmentation regions 316 and 318 are self-assembled monolayers ("SAM") of (para-terphenyl)-para-$SiOR_3$ molecules desirably having a thickness of one molecule on the dielectric layer 310. One advantage of such a procedure involving precursor application and conversion is that formation of a more highly ordered layer of the exemplary (para-terphenyl)-para-$SiOR_3$ may be possible than by direct application of such a compound. Alternatively, the exemplary (para-terphenyl)-para-$SiOR_3$ may be synthesized by carrying out analogous reactions in solution. Background information is provided in Collet, J., et al., "High Anisotropic Conductivity in Organic Insulator/Semiconductor Monolayer Heterostructure," Applied Physics Letters, Vol. 76, No. 10, pp. 1339–1341, Mar. 6, 2000; and in Collet, J. et al., "Nano-Field Effect Transistor with an Organic Self-Assembled Monolayer as Gate Insulator," Applied Physics Letters, Vol. 73, No. 18, pp. 2681–2683, Nov. 2, 1998, the entirety of both of which are hereby incorporated herein by reference.

The SAM blocks further bonding of compounds comprising reactive silicon atoms in the patterned areas on the dielectric layer 310 intended to constitute the semiconductor crystal nucleation augmentation regions 316 and 318. The patterned coating is permitted to remain undisturbed on the dielectric layer 310 for at least about 5 minutes. In alternative embodiments, a patterned coating of the first compound comprising reactive silicon atoms is applied to the dielectric layer 310 by methods such as ink jet printing, photolithography, and processes involving direct or indirect transfers from a transfer sheet or web to a desired substrate.

At step 830, the dielectric layer 310 is rinsed and dried. For example, the dielectric layer 310 can be rinsed twice with isopropanol and then dried for at least about 30 seconds with a stream of nitrogen.

At step 835, the dielectric layer 310 is exposed to a second compound comprising reactive silicon atoms. Where the first compound comprising reactive silicon atoms is designed to generate semiconductor crystal nucleation augmentation regions 316 and 318, the second compound comprising reactive silicon atoms is designed to generate semiconductor nucleation inhibition regions 330, 332 and 334. In one embodiment, the second solution comprising a compound comprising reactive silicon atoms is designed to generate semiconductor nucleation inhibition regions 330, 332 and 334. In such an embodiment, the second compound comprises reactive silicon atoms and a non-aromatic region as discussed earlier, such as dodecyl-$SiOR_3$. In one embodiment, a 2 millimolar solution of dodecyl-$SiOR_3$ in absolute ethanol is prepared. During step 835, the first compound comprising reactive silicon atoms blocks further bonding of compounds comprising reactive silicon atoms in the patterned areas intended to constitute the semiconductor crystal nucleation augmentation regions 316 and 318. Thus, the second compound comprising reactive silicon atoms only bonds to the dielectric layer 310 in the remaining areas intended to constitute the semiconductor nucleation inhibition regions 330, 332 and 334. Accordingly, the dielectric layer 310 can be simply immersed in the dodecyl-$SiOR_3$ solution for a moderate time period such as 30 minutes, to form the semiconductor nucleation inhibition regions 330, 332 and 334. The semiconductor nucleation inhibition regions 330, 332 and 334 are SAMs of dodecyl-$SiOR_3$ molecules desirably with a thickness of one molecule on the dielectric layer 310. The coatings are permitted to remain undisturbed on the dielectric layer 310 for at least about 5 minutes. In alternative embodiments, the second compound comprising reactive silicon atoms is applied to the dielectric layer 310 by methods such as ink jet printing, photolithography, and processes involving direct or indirect transfers from a transfer sheet or web to a desired substrate.

At step 840, the dielectric layer 310 is again rinsed and dried in the same manner as in step 830.

At step 845, the dielectric layer 310 is exposed to a solution of a selected aromatic organic semiconductor such as 5-chlorotetracene in the same manner as discussed above in connection with step 750 of FIG. 7. The promoted nucleation over the semiconductor crystal nucleation augmentation regions 316 and 318 results in a formation of polycrystalline semiconductor regions 326 and 328, respectively. The inhibited nucleation over semiconductor nucleation inhibition regions 330, 332 and 334 results there in small amounts of or no crystallization. In this manner, the semiconductor crystal nucleation augmentation regions 316 and 318 and the semiconductor nucleation inhibition regions 330, 332 and 334 collectively direct the formation of patterned polycrystalline semiconductor regions 326 and 328, which can include single crystals having dimensions that span the source and drain electrodes of a thin film transistor. At step 850, the completed transistors 302 and 304 are again rinsed and dried.

Figure 9:
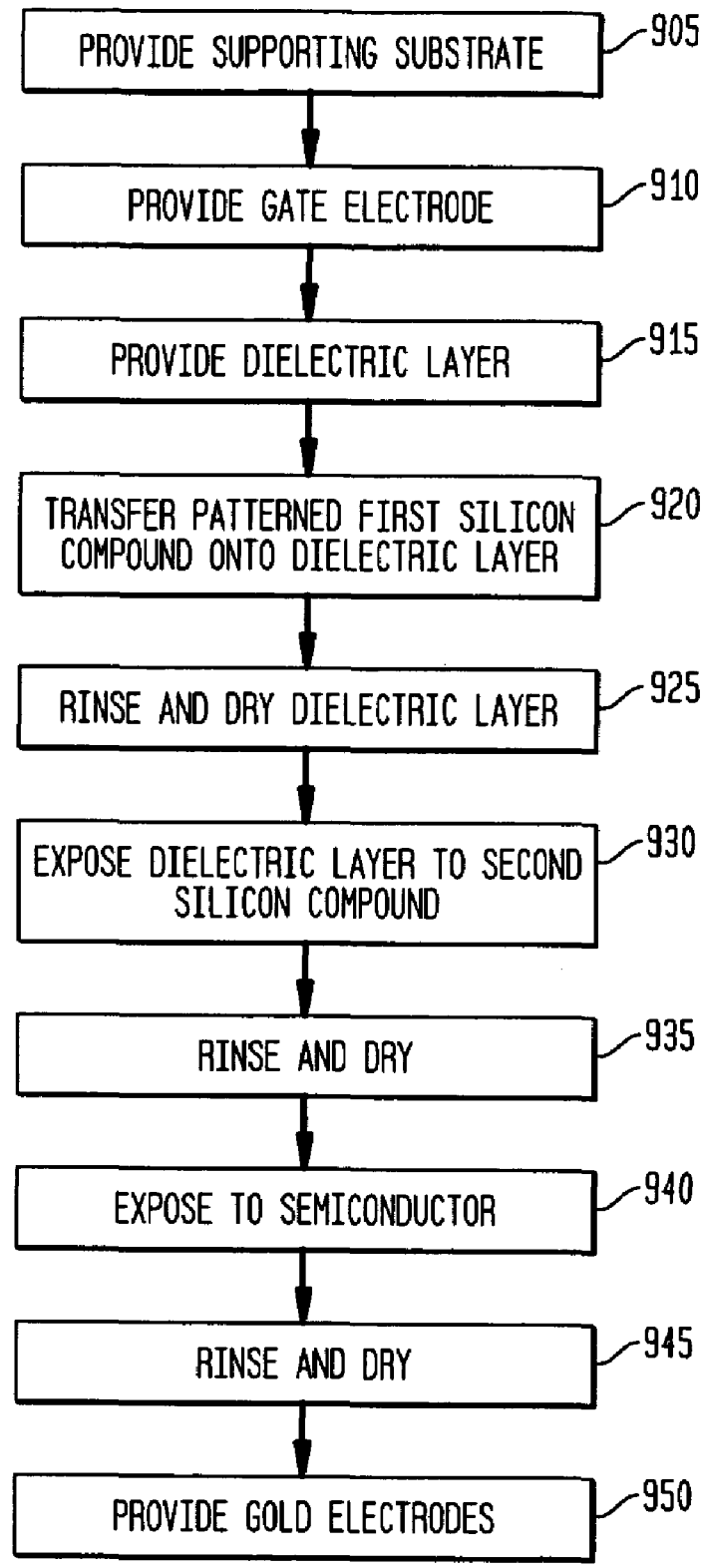
FIG. 9 shows a flow chart for an exemplary method of making the thin film transistors shown in FIGS. 5 and 6.

In another embodiment, thin film transistors 502 and 504 shown in FIGS. 5 and 6 having exemplary chlorotetracene polycrystalline semiconductor regions 510 and 516, respectively, are fabricated by an exemplary method 900 shown in FIG. 9.

Referring to FIG. 9, at step 905 a silicon wafer is provided in the same manner as discussed above in connection with step 805 of FIG. 8, to serve as the supporting substrate 534 shown in FIG. 6. At step 910, the gate electrode 532 is applied to the supporting substrate 534 in the same manner as discussed above in connection with step 810 of FIG. 8. At step 915, dielectric layer 518 is provided on the gate electrode 532 in the same manner as discussed above in connection with step 815 of FIG. 8. At step 920, a first compound containing reactive silicon atoms, such as $SiCl_3$ groups or $SiOR_3$ groups, is transferred to the dielectric layer 518, generally in the same manner as discussed above in connection with step 825 of FIG. 8. In one embodiment, the first such compound is tridecafluoro-1,1,2,2-tetrahydro-octyl-triethoxysilane, commercially available from Gelest, Tullytown, Pa. The tridecafluoro-1,1,2,2-tetrahydro-octyl-triethoxysilane is dissolved in ethanol to form a 1% solution by weight, and the PDMS stamp holding this solution is placed in contact with the dielectric layer 518 for about 2 minutes. At step 925, the dielectric layer 518 is rinsed and dried generally in the same manner as discussed above in connection with step 830 of FIG. 8, by baking at 130° C. for about 30 minutes, rinsing with 2-propanol, and drying with nitrogen gas for about 30 seconds. At step 930, the dielectric layer 518 is exposed to a second compound comprising reactive silicon atoms in the same manner as discussed above in connection with step 835 of FIG. 8. At step 935, the dielectric layer 518 is again rinsed and dried in the same manner as in step 925. At step 940, the dielectric layer 518 is exposed to a solution of a selected aromatic organic semiconductor such as 5-chlorotetracene in the same manner as discussed above in connection with step 845 of FIG. 8. The promoted nucleation over the semiconductor crystal nucleation augmentation regions 520 and 522 results in a formation of polycrystalline semiconductor regions 510 and 516, respectively. At step 945, the partially formed transistors 502 and 504 are again rinsed and dried in the same manner as discussed above in connection with step 925. At step 950, gold source and drain electrodes 506 and 508 are provided on semiconductor layer 510, and gold source and drain electrodes 512 and 514 are provided on semiconductor layer 516, in the same manner as discussed above in connection with step 820 of FIG. 8.

FIGS. 7–9 as discussed above relate to exemplary and non-limiting embodiments of methods that can be used. Other methods for making the exemplary devices shown in FIGS. 1–6 can also be used.

In one embodiment, microcontact printing (μCP) was used to pattern metal surfaces with different SAMs in order to selectively grow single crystals of semiconductor molecules and thus simulate transistor fabrication. All solvents and chemicals were of reagent grade and used as received unless otherwise stated. Methylene chloride, analytical grade potassium hydroxide, absolute ethanol, isopropanol, hydrogen peroxide (30% by weight in water), $H_2SO_4$ (95.8% in water), anthracene, tetracene, and tetrahydrofuran were all purchased from Sigma-Aldrich Chemicals (Milwaukee, Wis.). Polydimethyl siloxane (PDMS) was purchased from Dow Corning Corporation (Midland, Mich.). The compound 1-mercaptododecane was purchased from Alfa Aesar Co. The compounds triphenylthiol and biphenylthiol were synthesized using the procedures described in B. de Boer, H. Meng, D. F. Perepichka, J. Zheng, Y. Chabal, F. Wudl, P. G. Van Patten, and Z. Bao, "Synthesis and Characterization of Conjugated Mono- and Dithiol Oligomers and Characterization of Their Self-Assembled Monolayers", Langmuir, 19, pp. 4272–4284, (2003), which is hereby incorporated herein in its entirety. Trifluoroethanethiol, benzenethiol, $NH_2$—$(CH_2)_3$—SH, and COOH—$(CH_2)_{11}$SH were all purchased from Sigma-Aldrich Chemicals. All aqueous solutions were prepared with doubly distilled water.

Thin gold film substrates for adsorption of SAMs were prepared by sputtering 30 nanometers (nm) of gold with a 1 nm-thick underlayer of titanium onto silicon wafers. The gold substrates were then cleaned with a piranha solution and rinsed with water, acetone, and isopropanol.

PDMS stamps were prepared by mixing 10 parts of silicon elastomer base to one part of silicone elastomer curing agent. After thorough mixing of the two components, the PDMS mixture was carefully poured over a patterned silicon wafer "master" that was placed in a plastic Petri dish and dried in an oven at 65° C. for at least about 2 hours. The patterned silicon master was pretreated before application of the PDMS with a fluorinating silane for 15 minutes in the gas phase, to facilitate peeling of the cured PDMS off of the silicon wafer master after drying in the oven. After 2 hours of heat treatment, the PDMS was carefully removed from the patterned silicon master with a utility knife. The dimensions of the patterned squares of the PDMS relief stamp were 100 micrometers (μm)×100 μm, the squares being mutually separated by 200 um. Thiol-covered PDMS stamps were prepared by submerging cotton applicators into 2 millimolar (mM) thiol solutions and wiping the applicators across the PDMS stamp. The PDMS stamps were then dried with a stream of $N_2$ gas for at least about 1 minute to blow off excess thiol molecules. Up to 6 stampings were carried out with each SAM coating onto the PDMS. However, the first stamping was not used to avoid cross over of excess thiol onto the non-stamped regions.

The compounds mercaptododecane, $NH_2$—$(CH_2)_3SH$, and COOH—$(CH_2)_{11}SH$ were prepared in 2 mM concentrations in absolute ethanol. Methylene chloride was used to prepare 2 mM solutions of triphenylthiol, biphenylthiol and benzylthiol. Gold-coated silicon wafers were cut into rectangular pieces having dimensions of about 1×2 centimeters (cm) and treated with a piranha solution for 5 minutes. Next, the PDMS stamp was loaded with one of the thiols and carefully "wetted" onto the gold substrate. Background information is provided in Y. Xia and G. M. Whitesides, "Soft Lithography", Angew. Chem. Int. Ed. 1998, 37, pp. 550–575.), the entirety of which hereby is incorporated herein by reference. The substrate was then rinsed twice with isopropanol and dried under a stream of $N_2$ gas. The substrate was immediately used in a dip coater to expose the thiol-treated surface to a selected aromatic organic semiconductor. The SAM-patterned gold substrates were submerged into a quartz cuvette filled with a 3 mM solution of anthracene or tetracene. Methylene chloride was used as the solvent to dissolve the semiconductors. The substrates were soaked in the saturated solution of anthracene or tetracene for about 24 hours with a slow evaporation of the solvent and then pulled from the solution at a constant rate of between about 10 μm/second and about 100 μm/second. About 1 ml of solvent per 12 hours was evaporated per 5 ml of solution. The dip-coater was enclosed in a sealed acrylic chamber to retain constant humidity at room temperature. Samples were immediately placed in a nitrogen box after single-crystal patterning.

Table 1 shows the percent surface coverage of anthracene and tetracene crystals formed onto different SAMs

TABLE 1

Percent surface coverage of anthracene/tetracene crystals from different SAMs.

| SAM Type | Anthracene (%) | Tetracene (%) |
|---|---|---|
| triphenylthiol | 23.0 | 4.7 |
| biphenylthiol | 6.3 | NO GROWTH |
| Benzylthiol | 3.2 | NO GROWTH |
| mercaptododecane | 1.0 | NO GROWTH |
| HOOC—$(CH_2)_{11}SH$ | 2.4 | NO GROWTH |
| $HS(CH_2)_3NH_2$ | 1.9 | NO GROWTH |

The data show that the crystals preferentially grew onto the triphenylthiol modified surfaces compared to the other SAMs. The percent surface coverage of the crystals decreased with decreased aromatic ring moieties in the SAMs. Crystal growth onto non-aromatic SAMs produced about 90% less surface coverage than on the triphenylthiol SAM. There was 23% crystal growth for anthracene with a triphenylthiol SAM. However, there was only a 4.7% crystal growth for tetracene with a triphenylthiol passivated surface and no growth was observed with tetracene for the other SAMs.

Table 2 shows the surface coverage of the aromatic SAMs onto gold electrodes. There was more crystal growth onto surfaces that were least passivated. For example, triphenylthiol SAMs had a surface coverage of $1.93 \times 10^{-10}$ moles per square centimeter ($cm^2$) compared to a surface coverage of $2.35 \times 10^{-10}$ moles per $cm^2$ for benzenethiol, although there was approximately 7 times more crystal growth for surface prepared with triphenylthiol SAMs.

TABLE 2

Surface coverage of SAM onto gold substrates.

| SAM Type | Moles/$cm^2$ |
| --- | --- |
| triphenylthiol | $1.93 \times 10^{-10}$ |
| biphenylthiol | $2.23 \times 10^{-10}$ |
| Benzylthiol | $2.35 \times 10^{-10}$ |

Figure 10:
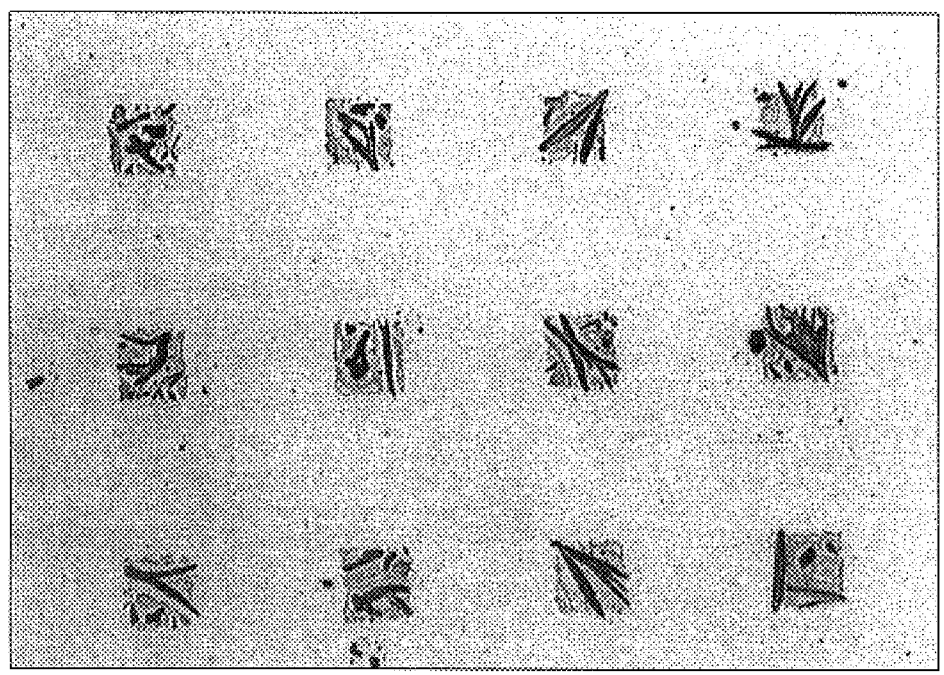
FIG. 10 shows results of an experiment in which a substrate was stamped in a pattern with triphenylthiol and then soaked into mercaptododecane, prior to exposure to and selective nucleation of monochlorotetracene.

The monochlorotetracene crystal growth study was then extended to the patterning of gold substrates with two different SAMs. One SAM comprising a phenylthiol was used to induce crystal growth, while the other comprising dodecylthiol or 2,2,2-Trifluoroethanethiol inhibited crystal growth. Monochlorotetracene crystals nucleated and subsequently grew only on triphenylthiol SAMs and not on biphenylthiol or phenylthiol SAMs. It is theorized that the strong pi-pi interaction between the oriented triphenylthiol monolayer and the semiconducting molecule reduced the interfacial energy between their surfaces and therefore decreased the induction time for the nucleation of the semiconductor on the triphenylthiol SAM. This resulted in the selective nucleation at the triphenylthiol regions and in the subsequent depletion of the less active SAMs. See J. Aizenberg, A. J. Black & G. M. Whitesides, "Control of nucleation by patterned self-assembled monolayers," Nature Vol. 398, pp. 495–498 (1999), the entirety of which is hereby incorporated herein by reference. FIG. 10 shows a substrate stamped with triphenylthiol and soaked into a mercaptododecane SAM, prior to nucleation of monochlorotetracene. The 100 μm² squares are composed of semiconductor monochlorotetracene (MCT) crystals that were grown by the dip-coating method.

The compound 5-chlorotetracene was synthesized as follows. All chemicals were purchased from Sigma-Aldrich Chemical Co. and used without further purification. The reaction apparatus was flame-dried and the reactions were carried out under a nitrogen atmosphere. NMR ($^1H$ and $^{13}C$) spectra were recorded on a Bruker 360 MHz spectrometer and chemical shifts were measured relative to trimethylsilane in $CDCl_3$ as solvent unless otherwise noted. Elemental analysis was performed by Roberson Microlit Laboratories, Madison, N.J. Melting points were uncorrected. Flash column chromatography was carried out on flash silica (Aldrich, 200–400 mesh). Anhydrous copper chloride ($CuCl_2$, 1.77 g, 13.2 mmol) and tetracene (3 g, 13.2 mmol) were placed in a flask containing chlorobenzene (100 mL) under $N_2$. The mixture was stirred at 100° C. for 3 hours. After toluene (50 mL) was added, the resulting mixture was filtered to remove unreacted copper chloride and the solvents were removed by rotary evaporation. The solid residue was chromatographed with $CH_2Cl_2$:hexane (1:10 volume/volume) and subsequently recrystallized from $CHCl_3$:methanol (3:1 volume/volume) to afford platelet-shaped crystals (1.20 g, 34.8%). mp 182° C. $^1H$ NMR δ 7.43 (m, $^3H$), 7.52 (t, $^1H$), 7.98 (t, $^2H$), 8.07 (d, $^1H$), 8.47 (d, $^1H$), 8.62 (s, $^1H$), 8.65 (s, $^1H$), 9.12 (s, $^1H$). Elemental analysis results: C, 82.16; H, 4.21; Cl, 13.38. Calculated for $C_{18}H_{11}Cl$: C, 82.29; H, 4.22; Cl, 13.49.

In one embodiment, given a voltage of −50V from source to drain across a test transistor, the charge carrier mobility of the semiconductor on the semiconductor crystal nucleation augmentation regions is desirably at least about $10^{-3}$ $cm^2$/Vs, preferably at least about $10^{-2}$ $cm^2$/Vs, and more preferably at least about 0.1 $cm^2$/Vs, at room temperature. The structure of the semiconductor regions on the semiconductor crystal nucleation augmentation regions desirably has an average crystal grain size of at least about 100 nanometers, and the grains desirably are connected in the high mobility region. In one embodiment, the semiconductor nucleation inhibition regions are characterized by low surface coverage of crystal grains, preferably no crystal growths, and the grains are disconnected leading to no conduction paths. In one embodiment, the mobility on the semiconductor nucleation inhibition regions is desirably within a range between about 0 $cm^2$/Vs and about $10^{-4}$ $cm^2$/Vs at room temperature. In one embodiment, the mobility of the semiconductor on the semiconductor crystal nucleation augmentation regions is at least about 10 times as large as the mobility on the semiconductor nucleation inhibition regions.

While the present invention has been disclosed in the context of various aspects of presently preferred embodiments, it will be recognized that the invention may be applied to other environments consistent with the claims which follow.

We claim:
1. A semiconductor apparatus, comprising:
   a substrate having a substrate surface;
   a first dielectric layer comprising molecules of a first compound, the molecules of the first compound having first ends and second ends, the first ends being covalently bonded to a first region of said substrate surface, said second ends having aromatic regions comprising at least y minus 2 conjugated pi-electrons, in which y is an integer of 10 or more; and
   a polycrystalline semiconductor layer comprising organic semiconductor molecules with aromatic portions comprising y conjugated pi-electrons, said polycrystalline semiconductor layer being on said first region of said substrate.
2. The semiconductor apparatus of claim 1, in which a single crystal of said organic semiconductor molecules is on at least about half of said first region.
3. The semiconductor apparatus of claim 1, further comprising:
   a gate electrode;
   a source electrode; and
   a drain electrode;
   said source and drain electrodes being in contact with a channel portion of said polycrystalline semiconductor layer on said first region, said gate electrode being positioned to control a conductivity of said channel portion.
4. The semiconductor apparatus of claim 1 further comprising a second dielectric layer comprising molecules of a second compound, the molecules of the second compound having third ends and fourth ends, the third ends being covalently bonded to a second region of said substrate surface, said fourth ends comprising no more than y minus 8 conjugated pi-electrons.

5. The semiconductor apparatus of claim 4 in which said first and second regions form a pattern on said substrate.

6. The semiconductor apparatus of claim 4, in which said fourth ends comprise a charged group.

7. The semiconductor apparatus of claim 6, in which said charged group is selected from the group consisting of carboxylic acid, suiphonate, phosphonate, and amino.

8. The semiconductor apparatus of claim 4, in which said fourth ends comprise a member selected from the group consisting of: biphenyl, phenyl, alkane, carboxylic acid, fluorinated hydrocarbon, and propyl amine.

9. The semiconductor apparatus of claim 4, in which said fourth ends comprise a member selected from the group consisting of alkane thiols and silanes having between 2 and 16 carbon atoms.

10. The semiconductor apparatus of claim 1, in which said molecules of the first compound comprise at least three conjugated aromatic rings.

11. A semiconductor apparatus, comprising:
a substrate having a substrate surface;
a first dielectric layer comprising molecules of a first compound, the molecules of the first compound having first ends and second ends, the first ends being covalently bonded to a first region of said substrate surface, said second ends having aromatic regions; and
a polycrystalline semiconductor layer comprising organic semiconductor molecules with aromatic portions, said polycrystalline semiconductor layer being on said first region of said substrate, in which said organic semiconductor molecules comprise a non-aromatic substituent.

12. A method of making a semiconductor apparatus, comprising the steps of:
providing a substrate having a substrate surface;
providing a first dielectric layer comprising molecules of a first compound, the molecules of the first compound having first ends and second ends, the first ends being covalently bonded to a first region of said substrate surface, said second ends having aromatic regions comprising at least y minus 2 conjugated ni-electrons, in which v is an integer of 10 or more; and
providing a polycrystalline semiconductor layer comprising organic semiconductor molecules with aromatic portions comprising y conjugated pi-electrons, said polycrystalline semiconductor layer being on said first region of said substrate.

13. The method of claim 12, further comprising the steps of:
providing a gate electrode;
providing a source electrode;
providing a drain electrode; and
placing said source and drain electrodes in contact with a channel portion of said polycrystalline semiconductor layer on said first region, said gate electrode being positioned to control a conductivity of said channel portion.

14. The method of claim 12, comprising the further step of applying a solution of said organic semiconductor molecules to said first region.

15. The method of claim 12 further comprising the step of providing a second dielectric layer comprising molecules of a second compound, the molecules of the second compound having third ends and fourth ends, the third ends being covalently bonded to a second region of said substrate surface, said fourth ends comprising no more than y minus 8 conjugated pi-electrons.

16. The method of claim 15 further comprising the step of forming a pattern by said first and second regions on said substrate.

17. An integrated circuit, comprising:
a substrate having a substrate surface;
a first dielectric layer comprising molecules of a first compound, the molecules of the first compound having first ends and second ends, the first ends being covalently bonded to a first region of said substrate surface, said second ends having aromatic regions comprising at least y minus 2 coniugated pi-electrons, in which y is an integer of 10 or more;
a polycrystalline semiconductor layer comprising organic semiconductor molecules with aromatic portions comprising y coniugated pi-electrons, said polycrystalline semiconductor layer being on said first region of said substrate;
a gate electrode;
a source electrode; and
a drain electrode;
said source and drain electrodes being in contact with a channel portion of said polycrystalline semiconductor layer on said first region, said gate electrode being positioned to control a conductivity of said channel portion.

18. The integrated circuit of claim 17, comprising a second dielectric layer comprising molecules of a second compound, the molecules of the second compound having third ends and fourth ends, the third ends being covalently bonded to a second region of said substrate surface, said fourth ends comprising no more than y minus 8 conjugated pi-electrons.

19. A method of making an integrated circuit, comprising the steps of:
providing a substrate having a substrate surface;
providing a first dielectric layer comprising molecules of a first compound, the molecules of the first compound having first ends and second ends, the first ends being covalently bonded to a first region of said substrate surface, said second ends having aromatic regions comprising at least y minus 2 coniugated ni-electrons, in which y is an integer of 10 or more;
providing a polycrystalline semiconductor layer comprising organic semiconductor molecules with aromatic portions comprising y coniugated pi-electrons, said polycrystalline semiconductor layer being on said first region of said substrate;
providing a gate electrode;
providing a source electrode;
providing a drain electrode; and
placing said source and drain electrodes in contact with a channel portion of said polycrystalline semiconductor layer on said first region, said gate electrode being positioned to control a conductivity of said channel portion.

20. The method of claim 19, further comprising the step of providing a second dielectric layer comprising molecules of a second compound, the molecules of the second compound having third ends and fourth ends, the third ends being covalently bonded to a second region of said substrate surface, said fourth ends comprising no more than y minus 8 conjugated pi-electrons.

* * * * *